United States Patent
Kim

(10) Patent No.: US 12,094,509 B2
(45) Date of Patent: Sep. 17, 2024

(54) MEMORY DEVICE WHICH GENERATES IMPROVED READ CURRENT ACCORDING TO SIZE OF MEMORY CELL

(71) Applicant: Samsung Electronics Co., Ltd., Suwon-si (KR)

(72) Inventor: Daeshik Kim, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 105 days.

(21) Appl. No.: 17/709,784

(22) Filed: Mar. 31, 2022

(65) Prior Publication Data

US 2022/0328085 A1    Oct. 13, 2022

(30) Foreign Application Priority Data

Apr. 7, 2021   (KR) .................. 10-2021-0045436

(51) Int. Cl.
*G11C 11/16*   (2006.01)
*G11C 17/16*   (2006.01)

(52) U.S. Cl.
CPC ........ *G11C 11/1673* (2013.01); *G11C 11/161* (2013.01); *G11C 11/1653* (2013.01); *G11C 11/1675* (2013.01); *G11C 11/1677* (2013.01); *G11C 17/16* (2013.01)

(58) Field of Classification Search
CPC ................................................. G11C 11/1673
See application file for complete search history.

(56) References Cited

U.S. PATENT DOCUMENTS

| | | | |
|---|---|---|---|
| 6,760,268 B2 | 7/2004 | Pelley | |
| 6,873,543 B2 | 3/2005 | Smith et al. | |
| 7,126,844 B2 | 10/2006 | Theel | |
| 8,094,480 B2 | 1/2012 | Tonomura | |
| 8,693,273 B2 | 4/2014 | Yuh et al. | |
| 8,929,127 B2* | 1/2015 | Antonyan | G11C 11/1693 365/171 |
| 9,099,188 B2 | 8/2015 | Guo | |
| 9,455,013 B2 | 9/2016 | Kim et al. | |
| 9,679,643 B1 | 6/2017 | Chou | |
| 10,255,974 B2 | 4/2019 | Lee | |
| 10,453,532 B1* | 10/2019 | Antonyan | G11C 11/1673 |
| 10,510,393 B2 | 12/2019 | Antonyan et al. | |
| 10,726,897 B1 | 7/2020 | Maffitt et al. | |

(Continued)

FOREIGN PATENT DOCUMENTS

| | | |
|---|---|---|
| JP | 2010-102767 A | 5/2010 |
| KR | 10-2016-0014473 A | 2/2016 |
| KR | 10-2097204 B1 | 4/2020 |

*Primary Examiner* — Douglas King
(74) *Attorney, Agent, or Firm* — Harness, Dickey & Pierce, P.L.C.

(57) ABSTRACT

Disclosed is a memory device including a magnetic storage element. The memory device includes a memory cell array, a voltage generator, and a write driver. The memory cell array includes a first region and a second region. The memory device is configured to store a value of a first read current determined based on a value of a reference resistance for distinguishing a parallel state and an anti-parallel state of a programmed memory cell. The sensing circuit is configured to generate the first read current based on the value of the first read current and to perform a read operation on the first region based on the first read current.

19 Claims, 17 Drawing Sheets

(56) References Cited

U.S. PATENT DOCUMENTS

| | | |
|---|---|---|
| 10,726,916 B2 | 7/2020 | Chou |
| 11,004,503 B1* | 5/2021 | Gupta .................. G11C 11/419 |
| 2009/0113259 A1* | 4/2009 | Aritome ............ G11C 16/3445 |
| | | 714/721 |
| 2011/0188305 A1* | 8/2011 | Yang .................. G11C 11/1673 |
| | | 365/171 |
| 2012/0069638 A1* | 3/2012 | Matsuda ............ G11C 11/1673 |
| | | 365/158 |
| 2013/0322162 A1* | 12/2013 | Lee .................... G11C 11/1675 |
| | | 365/158 |
| 2016/0035417 A1 | 2/2016 | Park et al. |
| 2019/0088299 A1* | 3/2019 | Antonyan .............. H10B 61/22 |
| 2019/0130966 A1* | 5/2019 | Danjean ................ G11C 16/26 |
| 2019/0180173 A1 | 6/2019 | Torng et al. |

* cited by examiner

MEMORY DEVICE WHICH GENERATES IMPROVED READ CURRENT ACCORDING TO SIZE OF MEMORY CELL

CROSS-REFERENCE TO RELATED APPLICATIONS

This application claims priority under 35 U.S.C. § 119 to Korean Patent Application No. 10-2021-0045436 filed on Apr. 7, 2021, in the Korean Intellectual Property Office, the disclosures of which are incorporated by reference herein in their entireties.

BACKGROUND

Inventive concepts relate to a semiconductor device, and more particularly, relates to a memory device including a magnetic tunnel junction element and/or a test method thereof.

Nowadays, various types of electronic devices are being used. As a high-speed and/or low-power electronic device are expected, the electronic device may require or use a memory device satisfying high reliability, high speed, and/or low power consumption. To at least partially satisfy the requirements, a magnetic memory element has been suggested as a memory element of the memory device. Because the magnetic memory element operates at a high speed and is nonvolatile, the magnetic memory element is a potential a next-generation semiconductor memory element.

In general, the magnetic memory element may include a magnetic tunnel junction (MTJ) element. The MTJ element may include two magnetic materials and an insulating layer interposed between the two magnetic materials. A resistance value of the MTJ element may vary depending on magnetization directions of the two magnetic materials. For example, the MJT element may have a large resistance value when the magnetization directions of the two magnetic materials are anti-parallel to each other and may have a small resistance value when the magnetization directions of the two magnetic materials are parallel to each other. Data may be written or read by using a difference between the resistance values.

Meanwhile, with regard to the reliability of the magnetic memory element, an issue such as read disturbance may occur in performing a read operation of the memory device by using a current (and/or voltage) of an excessive magnitude. A read disturbance may correspond to a disturbance according to a switch of a spin of the magnetic memory element. Additionally or alternatively, an issue such as read fail may occur in performing a read operation of the memory device by using a current (and/or voltage) of an insufficient magnitude. In particular, because a value of a read current (and/or voltage) is stored in the memory device by a memory vendor during a test process such as a wafer-test process, if once determined, the value of the read current (and/or voltage) may have a large influence on the performance of the memory device.

SUMMARY

Some example embodiments of inventive concepts provide a device and a method capable of determining a value of an improved (e.g. optimal) reference resistance through a reduced (e.g. the minimum number) of times of a program operation and determining a value of an improved (e.g. optimal) read current based on the value of the reference resistance thus determined.

According to some example embodiments, a memory device includes a memory cell array including a first region and a second region, the memory cell array configured to store a value of a first read current determined based on a value of a reference resistance to distinguish a parallel state and an anti-parallel state of a programmed memory cell and a sensing circuit configured to generate the first read current based on the value of the first read current and to perform a read operation on the first region based on the first read current.

According to some example embodiments, a method of operating a memory device includes programming the memory device to a first state, counting fail bits of the memory device programmed to the first state by using a variable resistor configured to be in a plurality of resistances having different values, for each reference resistance, programming the memory device to a second state, counting fail bits of the memory device programmed to the second state by using the variable resistor for each reference resistance, selecting a value of a reference resistance among the plurality of resistances, based on the counting results associated with the first state and the counting results associated with the second state, and determining a value of a read current for the memory device, based on the selected reference resistance value.

According to some example embodiments, a memory device includes a memory cell array including a first region, and a second region, the memory cell array configured to store a reference resistance value and a value of a read current determined based on the reference resistance value. The reference resistance value is determined based on a first result of counting a number of fail bits of the first region programmed to a first state for each resistance value and a second result of counting a number of fail bits of the first region programmed to a second state for each resistance value. The device further includes a column decoder configured to select a bit line connected to a memory cell selected from memory cells of the first region, a row decoder configured to drive the bit line connected to the selected memory cell, and a sensing circuit configured to generate a first read current based on the value of the read current and to read data stored in the selected memory cell based on the first read current.

BRIEF DESCRIPTION OF THE FIGURES

The above and other objects and features of inventive concepts will become apparent by describing in detail embodiments thereof with reference to the accompanying drawings.

DETAILED DESCRIPTION OF EXAMPLE EMBODIMENTS

Below, embodiments of inventive concepts may be described in detail and clearly to such an extent that an ordinary one in the art easily implements the invention.

In the detailed description, components described with reference to the terms "unit", "module", "block", "~er or ~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
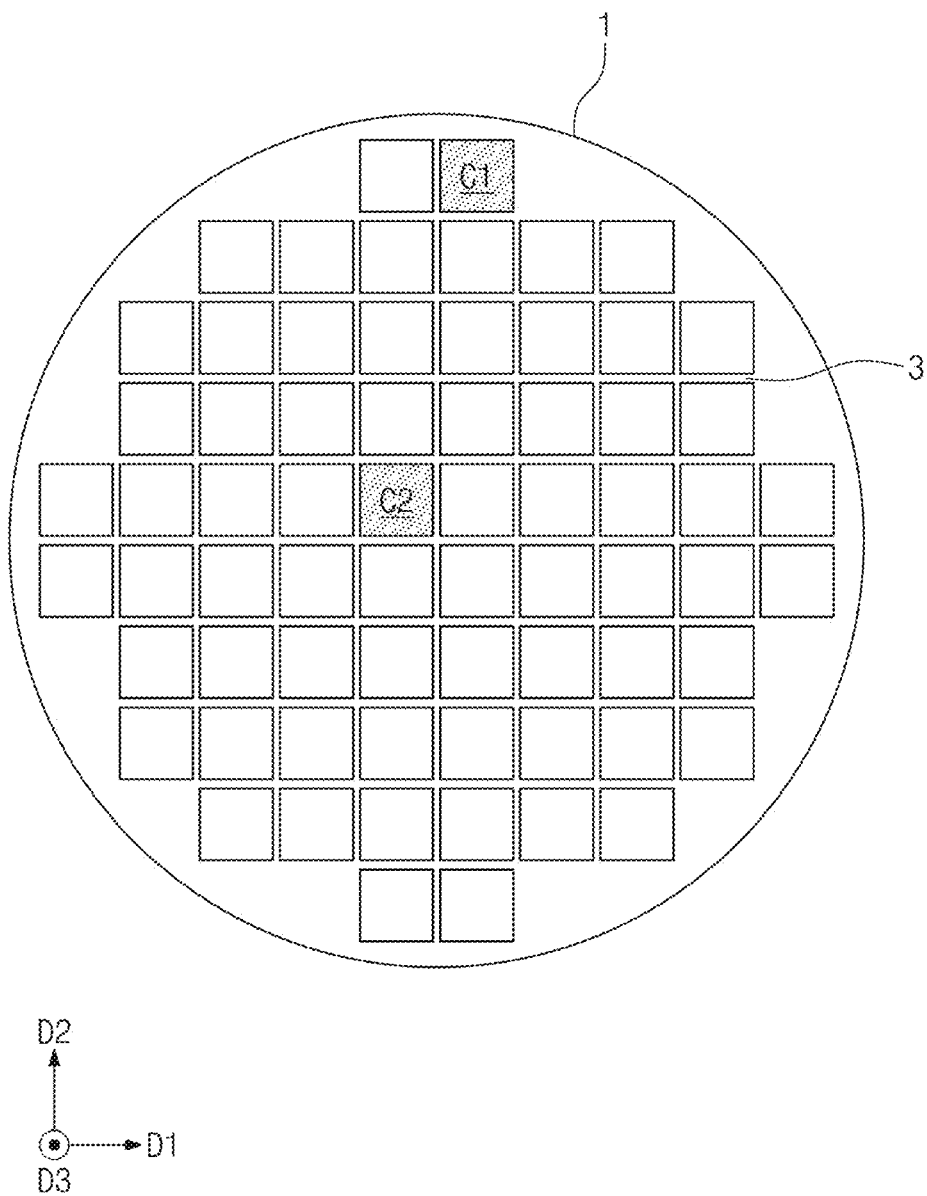
FIG. 1 illustrates a substrate where memory devices according to some example embodiments of inventive concepts are integrated.

FIG. 1 illustrates a substrate 1 where memory devices according to some example embodiments of inventive concepts are integrated. The substrate 1 may include a plurality of memory devices including a first memory device C1 and a second memory device C2, and a scribe line region 3 between the memory devices. The memory devices may be two-dimensionally arranged in a first direction D1 and a second direction D2. Each memory device may be surrounded by the scribe line region 3. For example, the scribe line region 3 may be defined between memory devices adjacent in the first direction D1 and between memory devices adjacent in the second direction D2. A width of the scribe line region 3 in the first direction may be the same as, or different from, a width of the scribe line region 3 in the second direction.

The first memory device C1 may be designed to be the same as or similar to the second memory device C2; however, example embodiments are not limited thereto. Furthermore the first memory device and/or the second memory device C2 may both be rectangular, e.g. square; however, example embodiments are not limited thereto. Alternatively or additionally the substrate 1 may be a wafer, such as a 200 mm diameter wafer or a 300 mm diameter wafer or a 450 mm diameter wafer; however, example embodiments are not limited thereto. The substrate 1 may include or be composed of a semiconductor material such as a single-crystal material, and/or may be lightly doped with impurities; however, example embodiments are not limited thereto. The substrate 1 may include a notch region (not shown) and/or a flat region (not shown); however, example embodiments are not limited thereto. Additionally or alternatively, a number of memory devices may be greater than, or less than, the number illustrated in FIG. 1.

In some example embodiments, the substrate 1 may be a semiconductor substrate such as a semiconductor wafer. The substrate 1 may be or may include a bulk silicon substrate, a silicon on insulator (SOI) substrate, a germanium substrate, a germanium on insulator (GOI) substrate, a silicon-germanium substrate, or a substrate of an epitaxial thin film provided through selective epitaxial growth (SEG). For example, the substrate 1 may include at least one of silicon (Si), germanium (Ge), silicon germanium (SiGe), gallium arsenic (GaAs), Indium Gallium Arsenide (InGaAs), aluminum gallium arsenide (AlGaAs), or a mixture thereof. The substrate 1 may have a single crystalline structure.

In some example embodiments, the first memory device C1 may indicate or correspond to a memory device provided relatively close to a periphery of the substrate 1, and the second memory device C2 may indicate a memory device provided relatively close to the center of the substrate 1.

Meanwhile, a program characteristic and/or a reference resistance characteristic of a memory device may vary, for example depending on a location on the substrate 1 at which the memory device is provided. For example, in the case where memory devices provided on the substrate 1 include MRAM cells, a size of an MRAM cell may vary depending on a location of a memory device in the substrate 1.

For example, a size of an MRAM cell of the first memory device C1 placed relatively close to the periphery of the substrate 1 may be relatively small (or, alternatively, relatively large) due to a manufacturing or fabrication process. In contrast, a size of an MRAM cell of the second memory device C2 placed relatively close to the center of the substrate 1 may be relatively large (or, alternatively, relatively small) due to the manufacturing or fabrication process. According to some example embodiments of inventive concepts, a value of an improved (e.g. optimal) read current for the corresponding chip may be determined in consideration of a relative location of the memory device in the substrate 1, e.g. according to a distance such as a Euclidean distance and/or a taxicab distance, e.g. from a center of the substrate 1. Accordingly, the read disturbance for a memory device may be prevented or reduced in likelihood and/or impact from occurrence, and/or the reliability of the memory device may be improved. This will be more fully described below.

Figure 2:
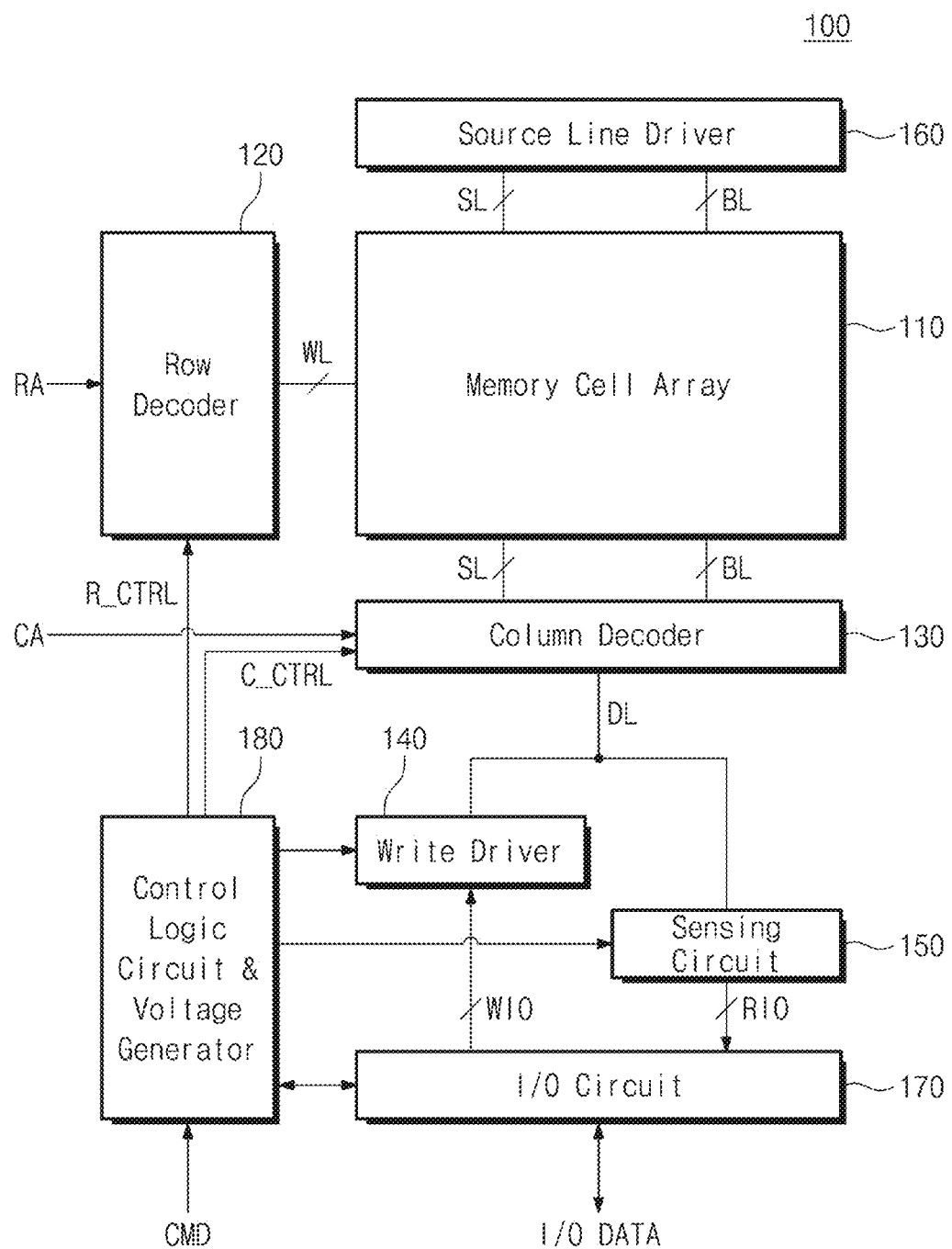
FIG. 2 illustrates a configuration of a memory device of FIG. 1.

FIG. 2 illustrates a configuration of the memory devices C1 and C2 of FIG. 1. In some example embodiments, a memory device 100 of FIG. 2 may be an example of implementing the memory devices C1 and C2 of FIG. 1. The memory device 100 may include a memory cell array 110, a row decoder 120, a column decoder 130, a write driver 140, a sensing circuit 150, a source line driver 160, an input/output circuit 170, and a control logic circuit and voltage generator 180.

The memory cell array 110 may include a plurality of memory cells each or some of which are configured to store data. The memory cell array 110 may or may not include dummy memory cells (not shown) that are not configured to store data; however, example embodiments are not limited thereto. For example, each memory cell may include a variable resistance element, and a value of data stored in the variable resistance element may be determined based on a resistance value of the variable resistance element. For example, each memory cell may include an MRAM (Magneto-resistive RAM) cell, an STT-MRAM (Spin Transfer Torque MRAM) cell, a PRAM (Phase-change RAM) cell, a ReRAM (Resistive RAM) cell, and/or the like. As used herein, the description will be given under the assumption that each memory cell includes an MRAM cell; however, example embodiments are not limited thereto.

The memory cells constituting or included in the memory cell array 110 may be connected with or to source lines SL, bit lines BL, and word lines WL. For example, memory cells arranged along a row may be connected in common to a word line corresponding to the row, and memory cells arranged along a column may be connected in common to a source line and a bit line corresponding to the column.

The row decoder 120 may receive a row address from the outside (not shown). The row decoder 120 may select (and/or drive) the word line WL connected with or to a memory cell targeted for a read operation or a program operation, based on a row address RA and on a row control signal R_CTRL. The row decoder 120 may provide the selected word line with a driving voltage received from the control logic circuit and voltage generator 180.

The column decoder 130 may receive a column address from the outside (not shown). The column decoder 130 may select the bit line BL and/or the source line SL connected with or to the memory cell targeted for the read operation or the program operation, based on a column address CA and a column control signal C_CTRL.

In a program operation, the write driver 140 may drive a program voltage (and/or a write current) for storing write data in a memory cell selected by the row decoder 120 and the column decoder 130. For example, in the program operation of the memory device 100, the write driver 140 may store the write data in the selected memory cell by controlling a voltage of a data line DL based on the write data provided from the input/output circuit 170 through a write input/output line WIO.

Meanwhile, the data line DL is illustrated for convenience of description and brevity of drawing, but the data line DL may be understood as corresponding to the bit line BL and the source line SL selected by the column decoder 130.

In a read operation, the sensing circuit 150 may sense a signal output through the data line DL and may determine a value of data stored in the selected memory cell. The sensing circuit 150 may be connected with or to the column decoder 130 through the data line DL and may be connected with or to the input/output circuit 170 through a read input/output line RIO. The sensing circuit 150 may output the sensed read data to the input/output circuit 170 through the read input/output line RIO.

The source line driver 160 may drive the source line SL with a voltage of a specific level, and may be under control of the control logic circuit and voltage generator 180, which may set the specific level. For example, the source line driver 160 may be provided with a voltage for driving the source line SL from the control logic circuit and voltage generator 180. For example, a value of a voltage that is applied from the source line driver 160 to the source line SL may be variable in the case of performing the program operation, such that a memory cell has a great/large resistance value (e.g., an anti-parallel state) or in the case of performing the program operation such that a memory cell has a small resistance value (e.g., a parallel state).

Meanwhile, although not illustrated in FIG. 2, the memory device 100 may further include a fuse-array and/or an anti-fuse array. The anti-fuse array includes anti-fuses arranged along rows and columns. For example, an anti-fuse that is a one-time programmable (OTP) memory may be nonvolatile. Information about the memory device 100 may be programmed in the anti-fuse array. For example, information about a fail address of the memory cell array 110, information about internal voltages (e.g., a program voltage and a read voltage) of the memory device 100, and the like may be written in the anti-fuse array. In particular, according to some example embodiments of inventive concepts, information about a value of an improved (e.g. optimal) program voltage determined in the process of testing a memory device may be programmed in the anti-fuse array.

The fuse array and/or the anti-fuse array may be programmed by passing an appropriate amount of current to blow the fuse/short the antifuse, and/or may be programmed by firing an appropriate laser pulse to specific elements of the fuse array and/or the anti-fuse array; however, example embodiments are not limited thereto.

Figure 3:
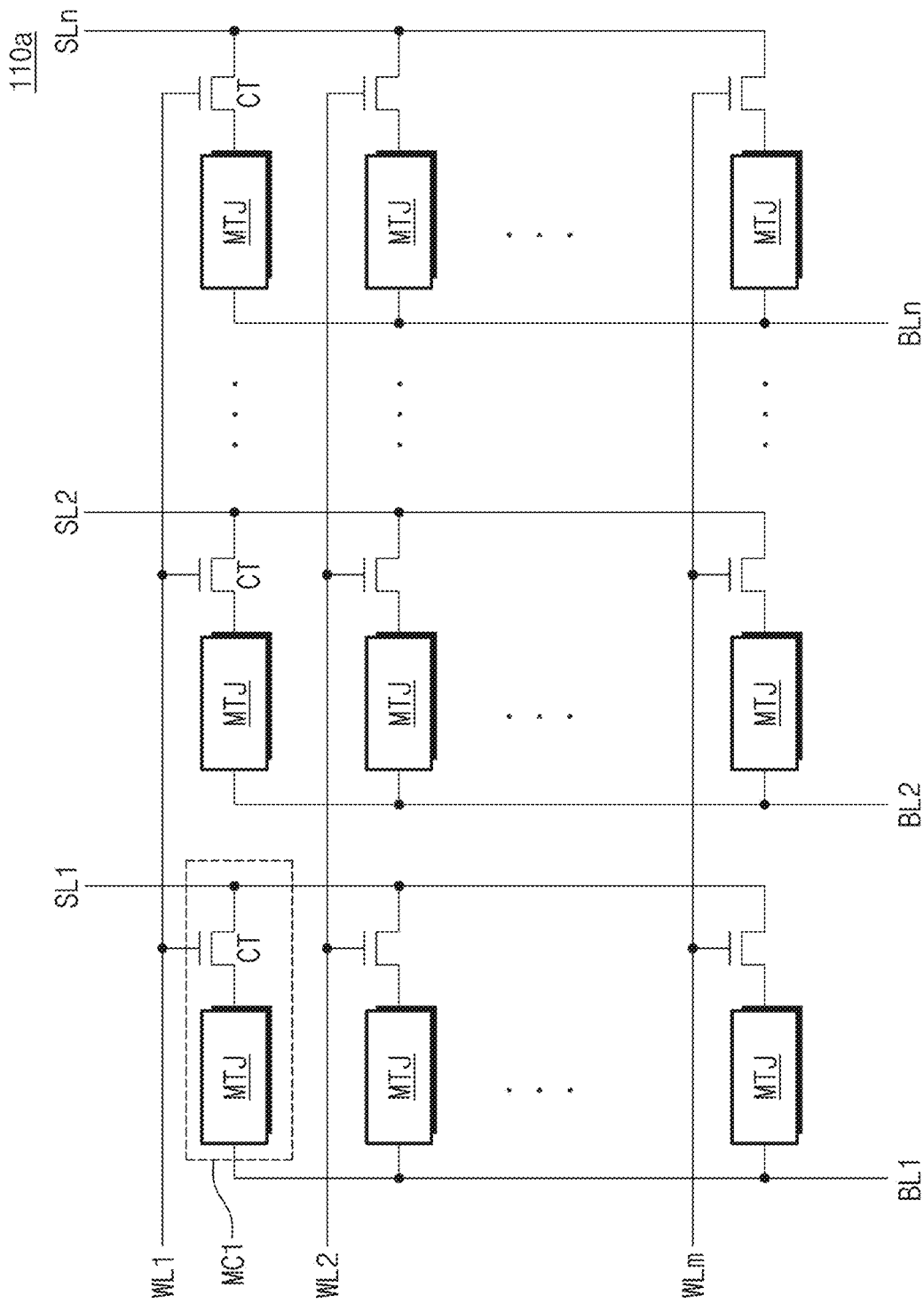
FIG. 3 is a circuit diagram illustrating a configuration of a memory cell array of FIG. 2.

FIG. 3 is a circuit diagram illustrating a configuration of the memory cell array 110 of FIG. 2. A memory cell array 110a may include a plurality of memory cells arranged in row and column directions. Each memory cell may include a magnetic tunnel junction (MTJ) element and a cell transistor CT, such as an NMOS cell transistor. As the MTJ element of each memory cell is programmed to have a specific resistance value, data corresponding to the specific resistance value may be stored in each memory cell. In some example embodiments, in FIG. 3, a memory cell indicated by a dotted box from among the plurality of memory cells is marked by "MC1". The memory cell array 110a illustrated in FIG. 3 may be an array of one transistor, one magnetic tunneling junction element (1T1MTJ) cells.

The plurality of memory cells may be connected with or to word lines WL1 to WLm, bit lines BL1 to BLn, and source lines SL1 to SLn. The word lines WL1 to WLm may correspond to rows, and the bit lines BL1 to BLn and the source lines SL1 to Sln may correspond to columns; however, example embodiments are not limited thereto. The number of rows m may be the same as, less than, or greater than the number of columns n. In the first memory cell MC1, a first end of the MTJ element may be connected with or to the first bit line BL1, and a second end of the MTJ element may be connected with or to a first end of the cell transistor CT. A second end of the cell transistor CT may be connected with or to the source line SL1, and a gate electrode of the cell transistor CT may be connected with or to the first word line WL1.

Figure 4:
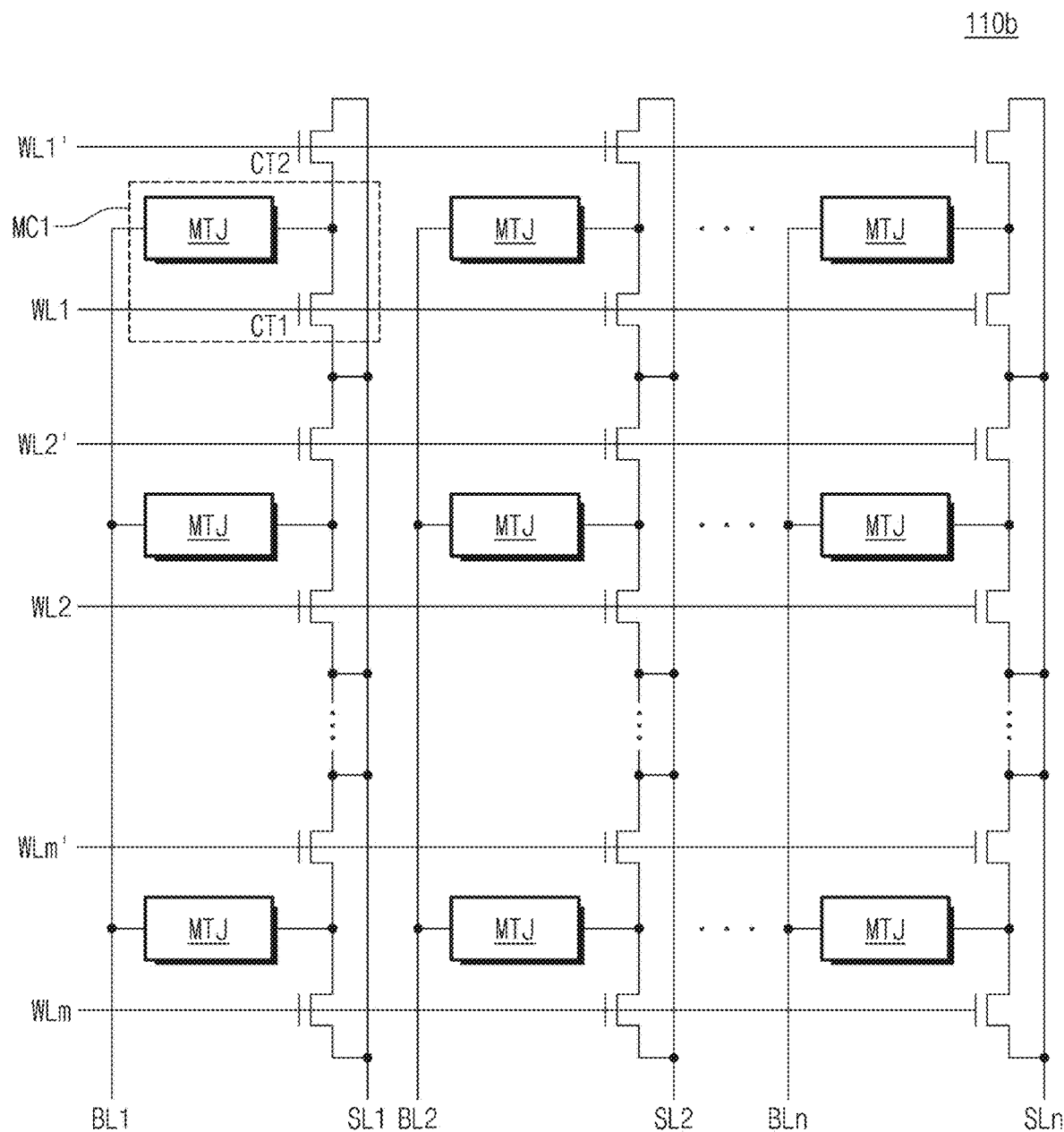
FIG. 4 is a circuit diagram illustrating a configuration of a memory cell array of FIG. 2.

FIG. 4 is a circuit diagram illustrating a configuration of the memory cell array 110 of FIG. 2. A memory cell array 110b may include a plurality of memory cells arranged in row and column directions. Each memory cell may include an MTJ element and two cell transistors. Some example embodiments is illustrated in FIG. 4 as a first memory cell MC1 indicated by a dotted box from among the plurality of memory cells includes an MTJ element, a first cell transistor CT1, and a second cell transistor CT2.

The first memory cell MC1 may have a structure in which the two cell transistors CT1 and CT2 share one MTJ element. In the first memory cell MC1, a first end of the MTJ element may be connected with or to the first bit line BL1, and a second end of the MTJ element may be connected with or to first ends of the first and second cell transistors CT1 and CT2. Second ends of the cell transistors CT1 and CT2 may be connected with or to the first source line SL1. A gate electrode of the first cell transistor CT1 may be connected with or to the first word line WL1, and a gate electrode of the second cell transistor CT2 may be connected with or to a first sub-word line WL1'. Each of the cell transistors CT1 and CT2 may be switched on or switched off by a signal (or a voltage) provided through the first word line WL1 or the first sub-word line WL1'. The memory cell array 110b illustrated in FIG. 4 may be an array of two transistors, one magnetic tunneling junction element (2T1MTJ) cells.

Figure 5:
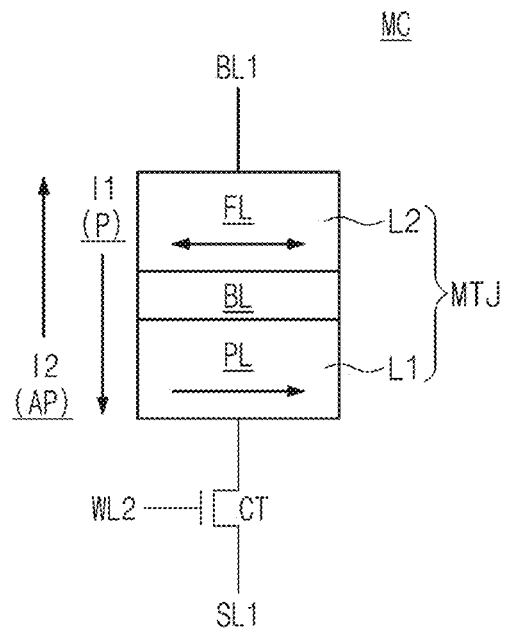
FIGS. 5 and 6 illustrate a configuration of a memory cell of FIG. 3.
Figure 6:
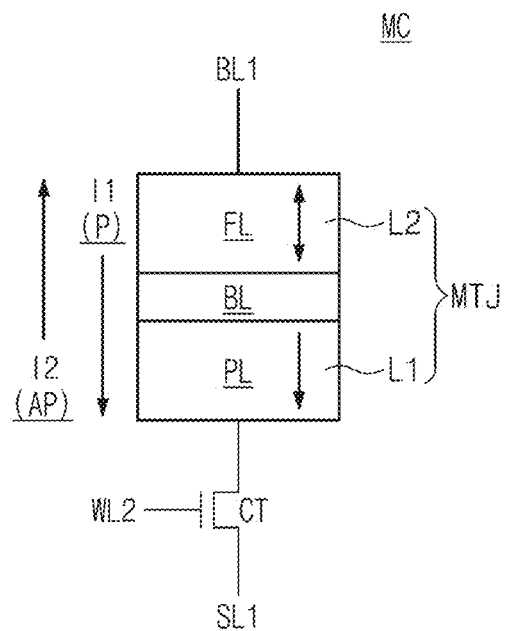

FIGS. 5 and 6 illustrate a configuration of a memory cell of FIG. 3.

Referring to FIGS. 5 and 6, an MTJ element may include a first magnetic layer L1, a second magnetic layer L2, and a barrier layer BL (or a tunneling layer) interposed between the first magnetic layer L1 and the second magnetic layer L2. The barrier layer BL may include at least one of magnesium (Mg) oxide, titanium (Ti) oxide, aluminum (Al) oxide, magnesium-zinc (Mg—Zn) oxide, or magnesium-boron (Mg—B) oxide, or a combination thereof. Each of the first magnetic layer L1 and the second magnetic layer L2 may include at least one magnetic layer, and may include the same or a different number of magnetic layers.

In detail, the first magnetic layer L1 may include a reference layer (e.g., a pinned layer PL) having a magnetization direction fixed (or pinned) in a specific direction, and the second magnetic layer L2 may include a free layer FL having a magnetization direction that is changeable to be parallel or anti-parallel to the magnetization direction of the reference layer. However, FIGS. 5 and 6 disclose, by means of example, the case where the first magnetic layer L1 includes the reference layer PL and the second magnetic layer L2 includes the free layer FL, but inventive concepts are not limited thereto. For example, unlike example embodiments illustrated in FIGS. 5 and 6, the first magnetic layer L1 may include a free layer, and the second magnetic layer L2 may include a pinned layer.

In some example embodiments, as illustrated in FIG. 5, magnetization directions may be mostly parallel to an interface of the barrier layer BL and the first magnetic layer L1. In this case, each of the reference layer PL and the free layer FL may include a ferromagnetic material. For example, the reference layer PL may further include an anti-ferromagnetic material for pinning a magnetization direction of the ferromagnetic material.

In some example embodiments, as illustrated in FIG. 6, magnetization directions may be mostly perpendicular to an interface of the barrier layer BL and the first magnetic layer L1. In this case, each of the reference layer PL and the free layer FL may include at least one of perpendicular magnetic materials (e.g., at least one of CoFeTb, CoFeGd, or CoFeDy), perpendicular magnetic materials with an L10 structure, CoPt-based materials with a hexagonal-close-packed-lattice structure, and perpendicular magnetic structures, or a combination thereof. The perpendicular magnetic material with the L10 structure may include at least one of FePt with the L10 structure, FePd with the L10 structure, CoPd with the L10 structure, or CoPt with the L10 structure, or a combination thereof. The perpendicular magnetic structure may include magnetic layers and non-magnetic layers that are alternately and repeatedly stacked. For example, the perpendicular magnetic anisotropy structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, (where n is the number of stacked pairs of layers), or a combination thereof. Here, a thickness of the reference layer PL may be greater than a thickness of the free layer FL, or a coercive force of the reference layer PL may be greater than a coercive force of the free layer FL.

In some example embodiments, when a voltage of a relatively high or large level (e.g. level in absolute value) is applied to the bit line BL1 and a voltage of a relatively low level (e.g. level in absolute value) is applied to the source line SL1, a write current I1 may flow. In this case, a magnetization direction of the second magnetic layer L2 may be identical to a magnetization direction of the first magnetic layer L1, and the MTJ element may have a low resistance value (e.g., a parallel state).

In contrast, when a voltage of a relatively high level (e.g. level in absolute value) is applied to the source line SL1 and a voltage of a relatively low level (e.g. level in absolute value) is applied to the bit line BL1, a write current I2 may flow. In this case, a magnetization direction of the second magnetic layer L2 may be opposite to a magnetization direction of the first magnetic layer L1, and the MTJ element may have a great resistance value (e.g., an anti-parallel state).

In some example embodiments, in the case where the MTJ element is in the parallel state, the memory cell MC may be regarded as storing data of a first value (e.g., logic "0"). In contrast, in the case where the MTJ element is in the anti-parallel state, the memory cell MC may be regarded as storing data of a second value (e.g., logic "1").

Meanwhile, only one cell transistor CT is illustrated in FIGS. 5 and 6, but the components illustrated in FIGS. 5 and 6 may also be applied to the memory cell of FIG. 4. In this case, the cell transistors CT1 and CT2 may be connected with or to one end of the MTJ element. A basic principle, an operation, and the like of the MTJ element may be identically applied to the memory cell of FIG. 4 except that a current path may change depending on a cell transistor turned on from among the cell transistors CT1 and CT2.

Figure 7:
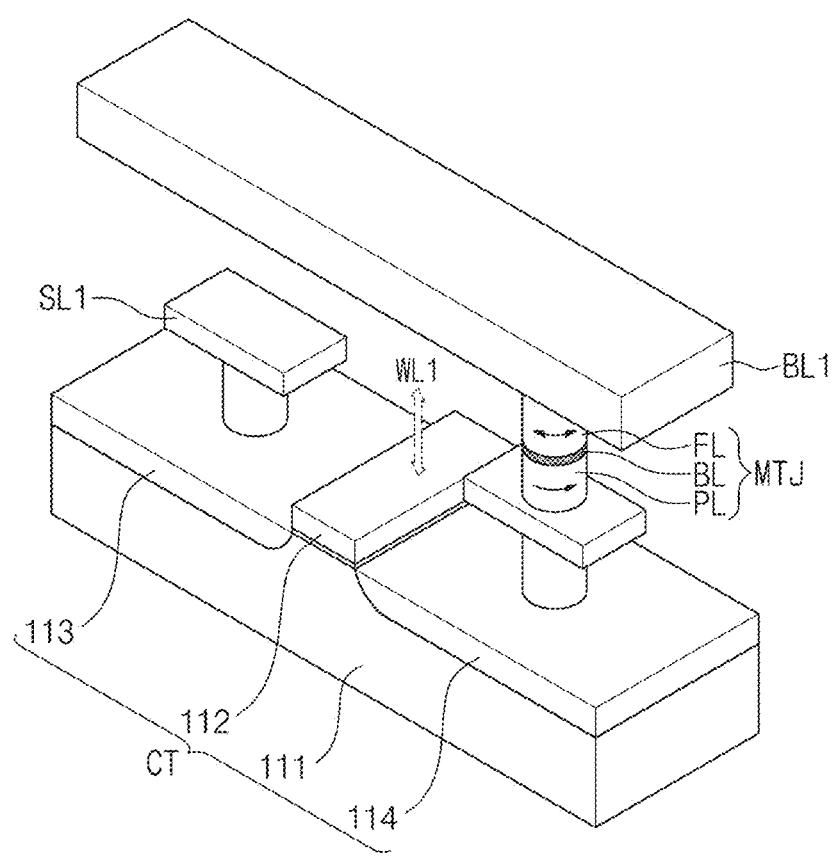
FIG. 7 is a conceptual diagram illustrating a configuration associated with a memory cell of FIG. 4.

FIG. 7 is a conceptual diagram illustrating a configuration associated with a memory cell of FIG. 4.

The cell transistor CT may include a body substrate 111, a gate electrode 112, and junctions 113 and 114. The junction 113 may be provided on the body substrate 111 and may be connected with or to the source line SL1. The junction 114 may be provided on the body substrate 111 and may be connected with or to the bit line BL1 through the MTJ element. The gate electrode 112 may be provided on the body substrate 111 between the junctions 113 and 114 and may be connected with or to the word line WL1. Meanwhile, the configuration of FIG. 7 is an example for illustrated purposes. Like example embodiments described with reference to FIG. 4, in the case where two cell transistors share one MTJ element, a modified version of the configuration illustrated in FIG. 7 may be adopted.

Figure 8:
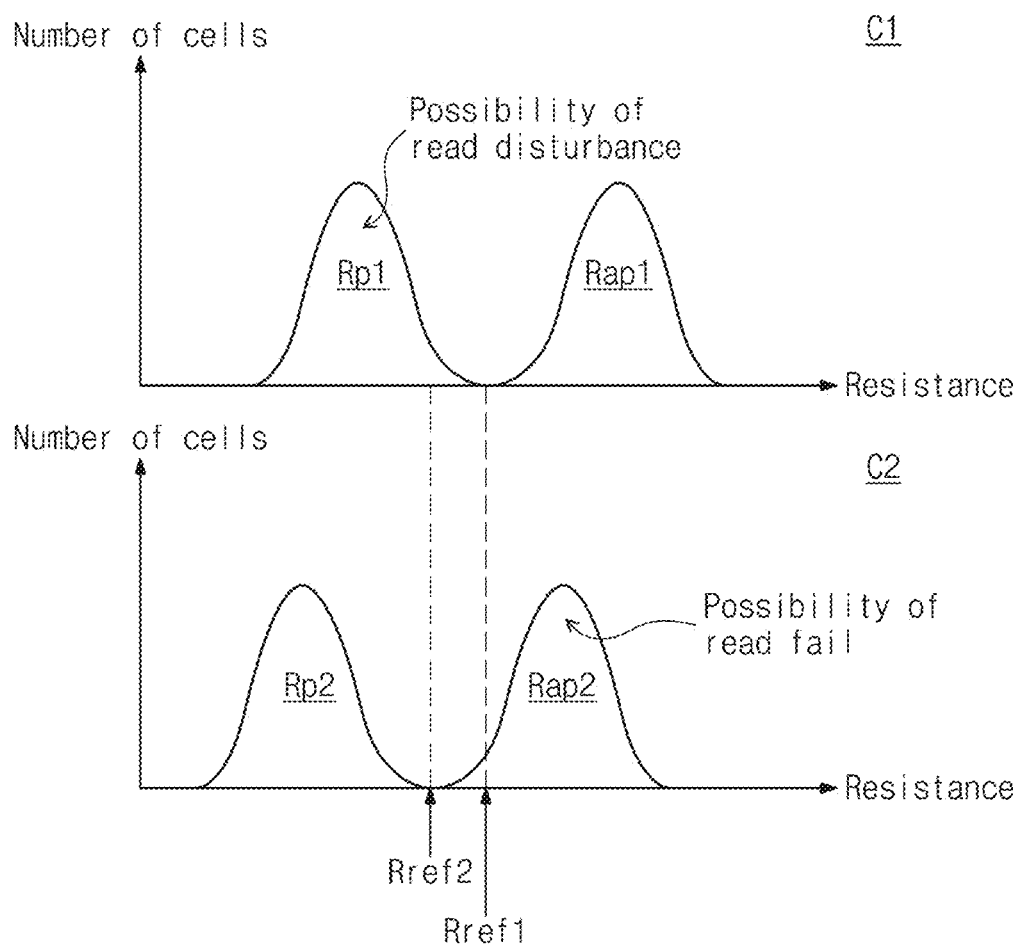
FIG. 8 illustrates a graph associated with a program state of a memory cell of FIG. 5 or 6.

FIG. 8 illustrates a graph associated with a program state of a memory cell of FIG. 5 or 6.

As briefly mentioned above with reference to FIG. 1, a program characteristic of a memory device may vary, for example depending on a location on the substrate 1, at which the memory device is provided. For example, a resistance distribution diagram corresponding to the first memory device C1 may be different from a resistance distribution diagram corresponding to the second memory device C2. For example, a resistance value that the first memory device C1 has may be mostly greater than a resistance value that the second memory device C2 has. Also, a value of a read current (or voltage) necessary to perform the read operation of the first memory device C1 may be mostly smaller than a value of a read current (or voltage) necessary to perform the read operation of the second memory device C2. The reason is that a size of an MRAM cell belonging to the first memory device C1 is mostly smaller than a size of an MRAM cell belonging to the second memory device C2.

Although FIG. 8 illustrates that first memory devices C1 have a larger cell resistance than second memory devices C2, example embodiments are not limited thereto. For example, the first memory devices C1 may have a smaller cell resistance than second memory devices C2. The resistance of the memory devices C1 and C2 may be determined by many factors, such as at least one of a photolithographic and/or etch critical dimension (CD) of various features or a dopant concentration of various features; however, example embodiments are not limited thereto.

First, referring to the graph corresponding to the first memory device C1, in the read operation, a resistance distribution Rp1 of memory cells programmed to the parallel state and a resistance distribution Rap1 of memory cells programmed to the anti-parallel state may be distinguished by a read current corresponding to a first reference resistance Rref1. Referring to the graph corresponding to the second memory device C2, in the read operation, a resistance distribution Rp2 of memory cells programmed to the parallel state and a resistance distribution Rap2 of memory cells programmed to the anti-parallel state may be distinguished by a read current corresponding to a second reference resistance Rref2.

However, a magnitude (e.g. an absolute value of a magnitude) of a read voltage corresponding to the first reference resistance Rref1 may be somewhat insufficient to determine a program state of the second memory device C2. A reason may be that a relatively large value of read current is required to determine a program state of the second memory device C2 in which a size of a memory cell is relatively large. For example, a read fail may occur when the read operation of the second memory device C2 is performed by using a read current corresponding to the first reference resistance Rref1.

In contrast, a magnitude of a read voltage corresponding to the second reference resistance Rref2 may be somewhat great to determine a program state of the first memory device C1. A reason may be that a relatively small value of read current is required to determine a program state of the first memory device C1 in which a size of a memory cell is relatively small. For example, when the read operation of the first memory device C1 is performed by using the read current corresponding to the second reference resistance Rref2, a read disturbance may occur due to a switch of a spin state.

As a result, when the read operation is performed on the memory devices C1 and C2 fabricated from one wafer (i.e., 1 of FIG. 1) by using the same read current, an unintended error may occur.

Figure 9:
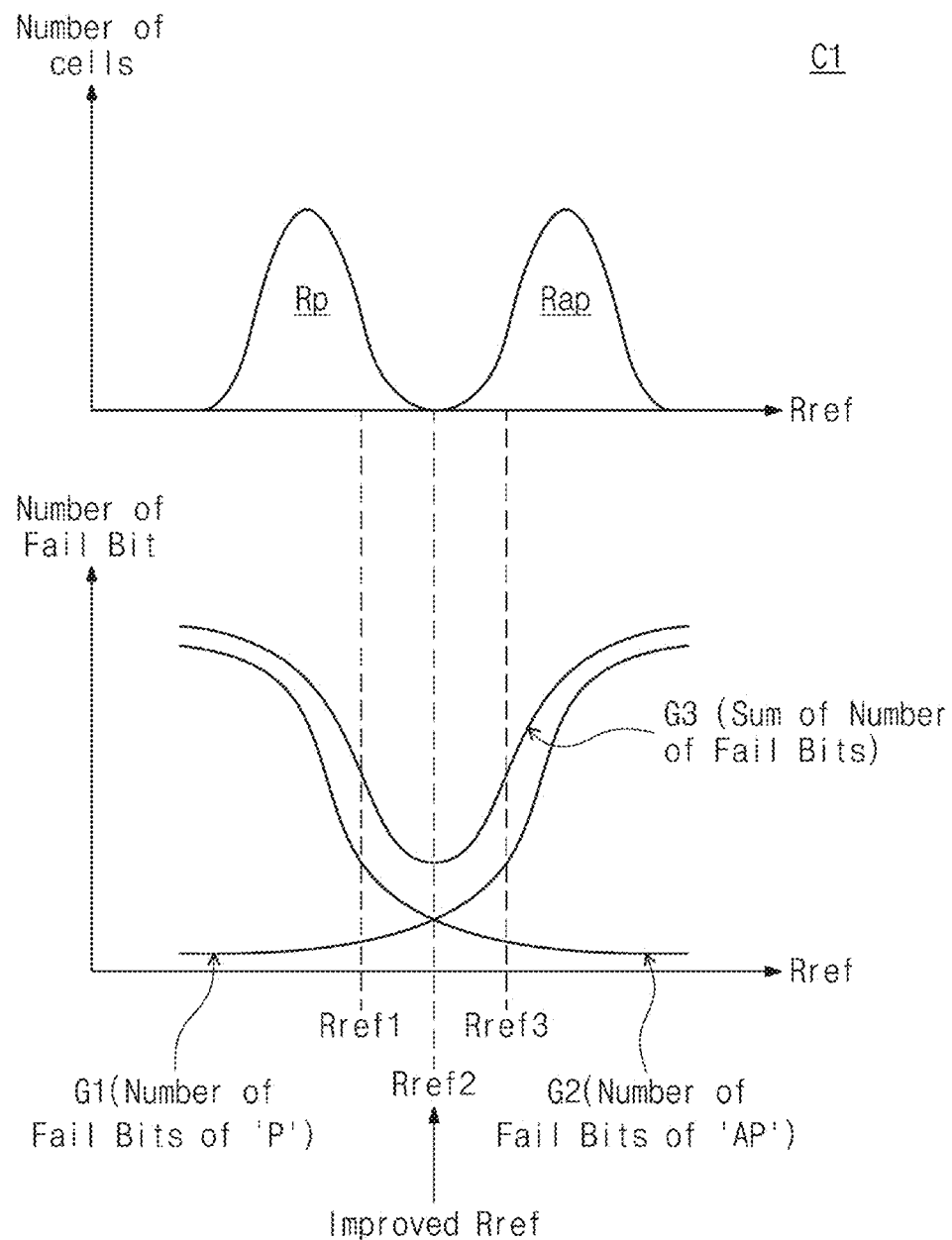
FIG. 9 conceptually illustrates how to determine a value of an improved (e.g. optimal) reference resistance for a memory device, according to some example embodiments of inventive concepts.

FIG. 9 conceptually illustrates how to determine a value of an improved (e.g. optimal) reference resistance for a memory device, according to some example embodiments of inventive concepts.

Referring to FIG. 9, in a test operation of a memory device, a pre-program operation of the memory device may be performed on. The test operation may be performed on the memory device C1 and/or C2 prior to the memory device C1 and/or C2 being packaged, e.g. while the memory device C1 and/or C2 is on the substrate 1; however, example embodiments are not limited thereto. Here, the pre-program operation may mean or correspond to a program operation for searching for an improved (e.g. optimal) reference resistance for distinguishing the parallel state and the anti-parallel state in the process of testing a memory device, not for storing data. For example, a program voltage that is applied to the memory device in the pre-program operation may be higher in level than a program voltage that is used in a normal program operation after the product shipping. This may be associated with preventing or reducing the likelihood of and/or impact from a program fail for the purpose of accurately performing the test operation.

First, memory cells of the memory device may be programmed to the parallel state by using a test device (e.g., automatic test equipment (ATE), e.g. prior to the memory devices being packaged). In FIG. 9, "Rp" indicates a distribution of resistance values of memory cells programmed to the parallel state. Afterwards, the number of fail bits of the memory device may be counted by using the test device. For example, in a case where the read operation is performed by using a read current corresponding to a reference resistance (e.g., the first reference resistance Rref1) of a relatively small value (e.g., by using a relatively great value of read current), the number of fail bits may be very small. As a value of the reference resistance becomes greater (or a value of a read current becomes smaller), the number of fail bits of the memory device may increase. A graph indicated by G1 shows the tendency of the number of counted fail bits. A subset of the memory cells may be programmed to the anti-parallel state; however, example embodiments are not limited thereto.

The memory cells of the memory device may be programmed to the anti-parallel state by using the test device, before or after the memory cells of the memory device have been programmed to the parallel state. A subset of the memory cells may be programmed to the anti-parallel state, which may or may not overlap with a subset of the memory cells programmed in the parallel state. In FIG. 9, "Rap" indicates a distribution of resistance values of memory cells programmed to the anti-parallel state. Afterwards, the number of fail bits of the memory device may be counted by using the test device. For example, in a case where the read operation is performed by using a read current corresponding to a reference resistance (e.g., the first reference resistance Rref1) of a relatively small value (e.g., by using a relatively great value of read current), the number of fail bits may be very great. However, as a value of the reference resistance becomes greater (and/or a value of a read current becomes smaller), the number of fail bits of the memory device may decrease. A graph indicated by G2 shows the tendency of the number of counted fail bits.

Afterwards, the test device may determine a value of an improved (e.g. optimal) reference resistance by using the number of counted fail bits. For example, the test device may sum the graph G1 indicating the number of fail bits measured in the parallel state and the graph G2 indicating the number of fail bits measured in the anti-parallel state. A graph indicated by G3 may be drawn as a sum result. In the graph indicated by G3, a resistance value (e.g., Rref2) corresponding to the smallest number of fail bits may be a value of an improved (e.g. optimal) reference resistance of the memory device.

Afterwards, the test device may determine a value of an improved (e.g. optimal) read current for the memory device, based on the improved (e.g. optimal) reference resistance value (e.g., Rref2). A value of the read current may be drawn from or based on a size of an MRAM cell measured in advance, a reference resistance value according to the size of the MRAM cell, and a value of a program voltage according to the reference resistance value.

In some example embodiments, the case where an improved (e.g. optimal) reference resistance value is relatively small (e.g., Rref1) may mean that or correspond to a size of an MRAM cell of the memory device is relatively large, which may mean that a relatively great value of read current is required or is used. In contrast, the case where an improved (e.g. optimal) reference resistance value is relatively great (e.g., Rref3) may mean that a size of an MRAM cell of the memory device is relatively small, which may mean that a relatively small value of read current is required or is used.

Assuming that the above conditions are applied to the first memory device C1 and the second memory device C2 of FIG. 1, there may be an occurrence wherein an improved (e.g. optimal) reference resistance value of the first memory device C1 is relatively great (e.g., Rref3) and thus a relatively small value of read current is required or used in the read operation of the first memory device C1. As in the above description, there may be an occurrence wherein an improved (e.g. optimal) reference resistance value of the second memory device C2 is relatively small (e.g., Rref1) and thus a relatively great value of read current is required or used in the read operation of the second memory device C2.

Finally, the test device may store the measured reference resistance value and a value of a read current corresponding thereto in or within the memory device, e.g. store the read current in a fuse array and/or an anti-fuse array. After the memory device is used by the end user, an improved (e.g. optimal) read current value stored in the memory device may be used in the normal read operation. According to some example embodiments, an improved (e.g. optimal) reference resistance value and an improved (e.g. optimal) read current value of the memory device may be determined through two, e.g. only two, pre-program operations, and thus, a time and costs necessary to perform a test operation for determining a read current value may decrease. In addition, as a value of an improved (e.g. optimal) read current is selected depending on a location on the substrate 1, at which the memory device is provided, after the product shipping, the reliability and the endurance of the memory device in the read operation may be improved.

Figure 10:
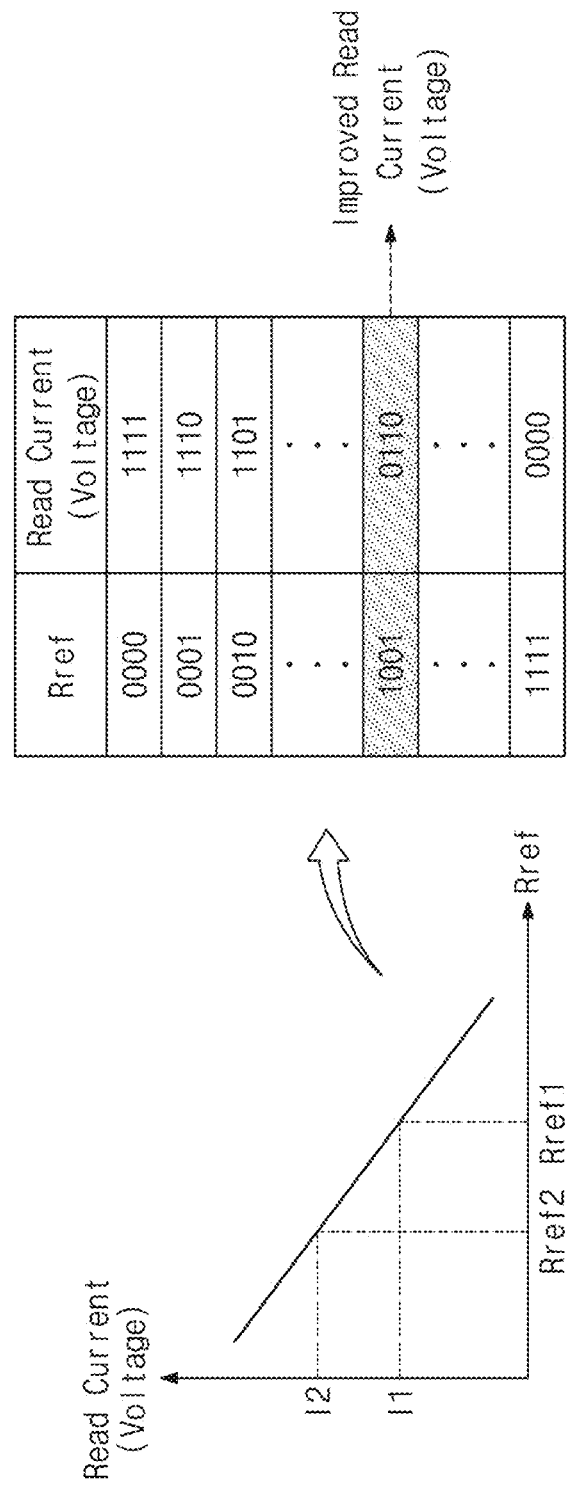
FIG. 10 conceptually illustrates a relationship between an improved (e.g. optimal) reference resistance value and an improved (e.g. optimal) read current value determined in a test operation of a memory device.

FIG. 10 conceptually illustrates a relationship between an improved (e.g. optimal) reference resistance value and an improved (e.g. optimal) read current value determined in a test operation of a memory device.

In some example embodiments, a reference resistance value of a memory device may be inversely proportional to an improved (e.g. optimal) read current (and/or voltage) value of the memory device, which corresponds to the reference resistance value. However, the reference resistance value of the memory device may not be accurately inversely proportional to the improved (e.g. optimal) read current value corresponding thereto. It should be understood that a read current value decreases as a reference resistance value increases, and the relation may be linear or non-linear.

A graph of FIG. 10 conceptually shows that a relatively great value of the first reference resistance Rref1 corresponds to the first memory device C1 provided relatively close to the periphery of the substrate 1 of FIG. 1 and a value of an improved (e.g. optimal) read current corresponding thereto is "I1" being relatively small. A reason may be that a relatively small value of read current is required due to a relatively small size of an MRAM cell of the first memory device C1.

In contrast, the graph of FIG. 10 conceptually shows that a relatively small value of the second reference resistance Rref2 corresponds to the second memory device C2 provided relatively close to the center of the substrate 1 of FIG. 1 and a value of an improved (e.g. optimal) read current corresponding thereto is "I2" being relatively great. A reason may be that a relatively great value of read current (and/or voltage) is required or used due to a relatively large size of an MRAM cell of the second memory device C2.

Meanwhile, a relationship between an improved (e.g. optimal) reference resistance value and a read current value of the memory device may be managed in the form of a table. In some example embodiments, each of an improved (e.g. optimal) reference resistance value and a read current (and/or voltage) value may be expressed by 4 bits, but is not limited thereto. In the case where a reference resistance value is expressed by 4 bits, the fail bit counting operation described with reference to FIG. 9 may be performed as much as 16 times or less for each fail bit counting operation for the parallel state and for each fail bit counting operation for the anti-parallel state. For example, a read current (or and/voltage) may be variable between a first value corresponding to "1111" and a second value corresponding to "0000".

An improved (e.g. optimal) reference resistance value (e.g., "1001") and a read current value (e.g., "0110") corresponding thereto may be stored in the memory device in the process of testing the memory device. Alternatively, the table illustrated in FIG. 10 may be stored in the memory device. In this case, a reference resistance value (e.g., "1001") and a read current value (e.g., "0110") corresponding to the memory device may be directed in the read operation when the memory device is used by the end user. For example, an improved (e.g. optimal) reference resistance value, a read current value corresponding thereto, and/or the table may be stored in a fuse array and/or an anti-fuse array or the like of the memory device, but inventive concepts are not limited thereto.

Figure 11:
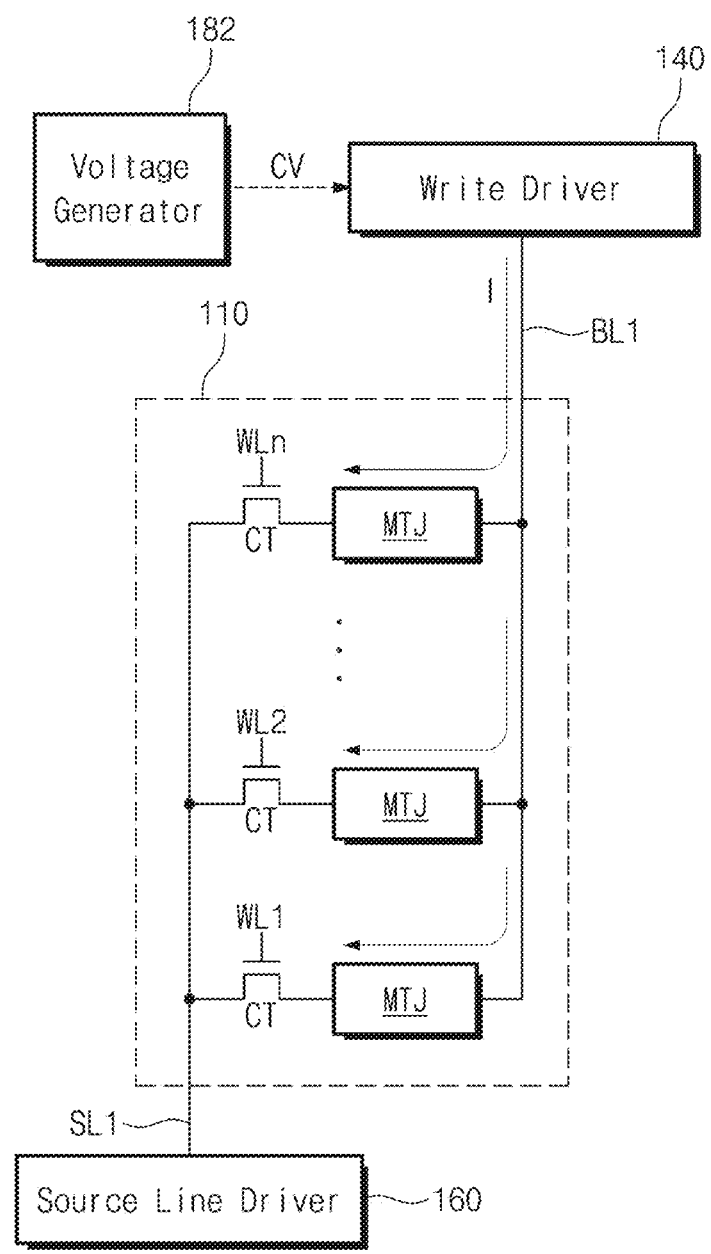
FIG. 11 conceptually illustrates how a memory device is tested, according to some example embodiments of inventive concepts.

FIG. 11 conceptually illustrates how a memory device is tested, according to some example embodiments of inventive concepts. In detail, FIG. 11 may be associated with a pre-program operation of a memory device, which is performed in the process of testing the memory device. The testing may be performed on the memory device C1 or C2 illustrated in FIG. 1, and/or may be performed after the memory device C1 or C2 has been packaged.

The memory cell array 110 may include a plurality of memory cells each including an MTJ element and a cell transistor. The write driver 140, the source line driver 160, and a voltage generator 182 are illustrated together with the memory cell array 110. For example, the voltage generator 182 may be a part of the control logic circuit and voltage generator 180 of FIG. 2. Only "n" memory cells connected with or to the first bit line BL1 and the first source line SL1 are illustrated for convenience of description and brevity of drawing.

First, the voltage generator 182 may be configured to generate a voltage for the pre-program operation to be performed on the memory cell array 110. Here, the expression "voltage for the pre-program operation" may mean a voltage, the level of which is sufficiently high to such an extent as a program fail does not occur at memory cells. For example, a value of the voltage for performing the pre-program operation may be greater than a value of a program voltage that is used in a normal program operation capable of being performed by the end user, but inventive concepts are not limited thereto. For example, a value of the voltage for performing the pre-program operation may be implemented by a code value CV for turning on/off respective elements (e.g., respective transistors) constituting the write driver 140.

The write driver 140 may perform the pre-program operation on memory cells based on the code value CV. The pre-program operation may include programming the memory cells to the parallel state and programming the memory cells to the anti-parallel state. For example, the write driver 140 may output a write current "I" corresponding to the code value CV. For example, the write driver 140 may include a driver circuit configured to generate the write current "I" for the purpose of performing the pre-program operation on the memory cells.

Figure 12:
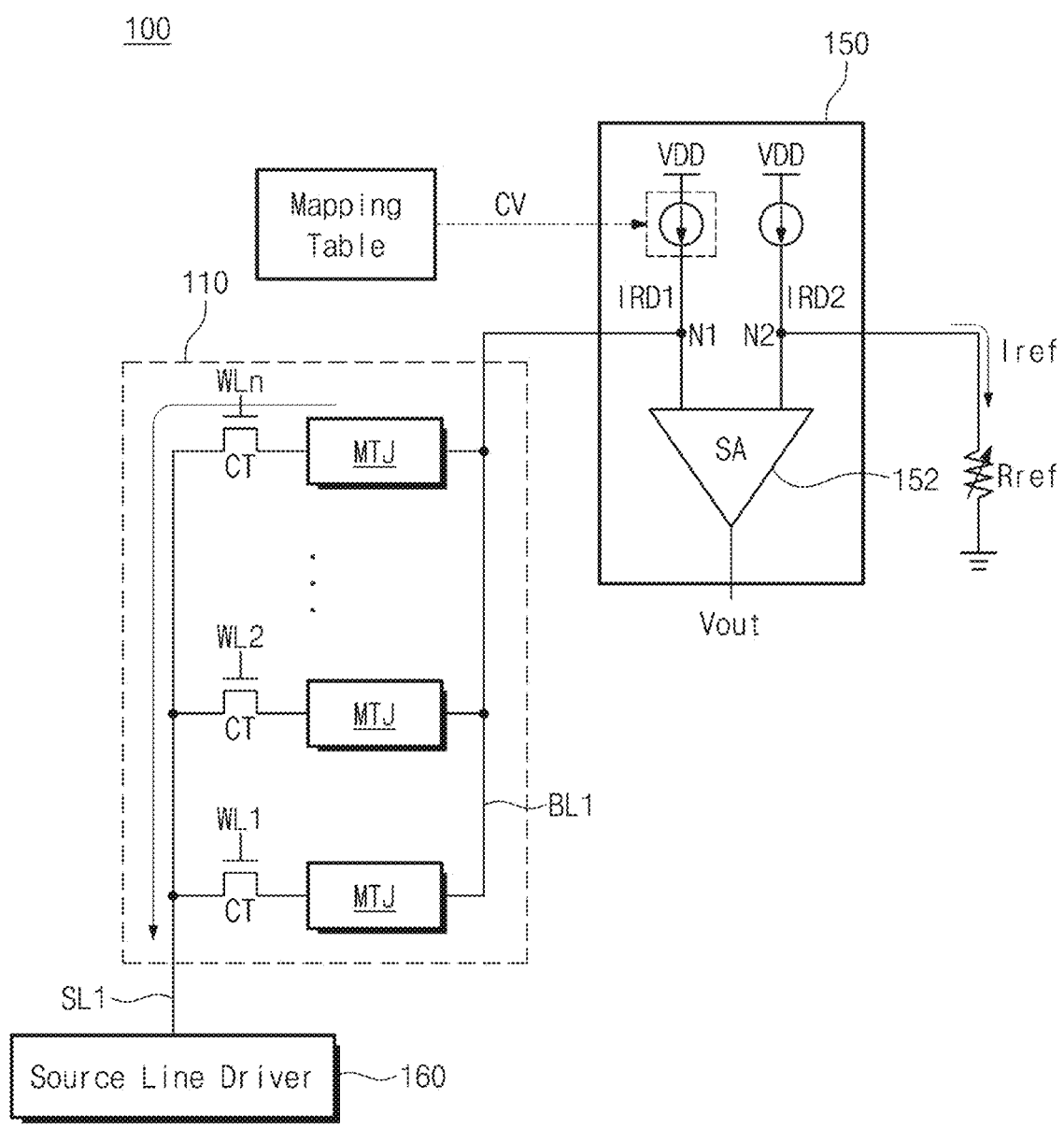
FIG. 12 conceptually illustrates how to perform a test operation on a memory device, according to some example embodiments of inventive concepts.

FIG. 12 conceptually illustrates how to perform a test operation on a memory device, according to some example embodiments of inventive concepts. In detail, example embodiments of FIG. 12 may be associated with determining an improved (e.g. optimal) reference resistance value, which is performed in the process of testing a memory device. For example, a test operation to be described with reference to FIG. 12 may be performed after the test operation described with reference to FIG. 11. For convenience of description, it is assumed that the memory cells of FIG. 12 are programmed to the parallel state.

The memory cell array 110 may include a plurality of memory cells connected with or to a plurality of bit lines and a plurality of source lines. Each memory cell may include an MTJ element and a cell transistor. Only memory cells connected with or to the first bit line BL1 and the first source line SL1 are illustrated for brevity of drawing. The first bit line BL1 may be connected with or to a first node N1, and the first source line SL1 may be connected with or to the source line driver 160.

A resistance of a variable reference resistor Rref may be associated with a reference voltage Vref necessary or used to read data stored in a memory cell of the memory cell array 110. For example, the variable reference resistor Rref may be implemented with gate poly silicon necessary to form or used in a gate electrode of a transistor (e.g., the cell transistor CT) in the process of fabricating the memory device 100. In this case, a resistance value of the variable reference resistor Rref may be easily changed by adjusting a length and/or the like of the implemented gate poly silicon, and thus, as described with reference to FIGS. 9 and 10, fail bits according to a read current corresponding to the value of the reference resistance Rref, which is variable, may be counted.

The sensing circuit 150 may be configured to read data stored in a memory cell connected with or to the first bit line BL1. For example, the sensing circuit 150 may include current sources generating a first read current IRD1 and a second read current IRD2, and a sense amplifier 152. The first read current IRD1 may be generated based on the code value CV including information about an improved (e.g. optimal) read current of inventive concepts, which is described with reference to FIGS. 9 and 10. For example, the code value CV may be based on an improved (e.g. optimal) reference current value of the table of FIG. 10.

The first read current IRD1 may be used to sense a voltage drop in the selected memory cell of the first bit line BL1. For example, the first read current IRD1 may be input to a word line (i.e., WL2) of the selected memory cell connected with or to the first bit line BL1. As a result, a voltage drop may occur at the MTJ element connected with or to the second word line WL2.

The second read current IRD2 may be used to determine a voltage drop in the reference resistance of the variable resistor Rref connected with or to a second node N2 through a reference bit line Rref BL. For example, the second read current IRD2 may flow through the variable resistor Rref, and thus, a voltage drop may occur at the reference resistance Rref. A reference current Iref is illustrated in FIG. 12 to show a current flowing through the reference resistance Rref, but the reference current Iref may be regarded as substantially identical to the second read current IRD2.

The sense amplifier 152 may sense a voltage difference between the first node N1 and the second node N2 and may amplify the sensed voltage difference. For example, a voltage level of the first node N1 may be different from a voltage level of the second node N2. The amplified voltage difference may be output as an output voltage Vout and may be used to determine data read from the memory cell.

In some example embodiments, in the process of testing the memory device 100, the number of fail bits of memory cells in the memory cell array 110 may be counted whenever a resistance value of the variable resistor Rref is changed. For example, in the case where the memory cells of the memory cell array 110 are programmed to have the parallel state, the number of fail bits according to a resistance value of the variable resistor Rref may have the tendency corresponding to the graph G1 of FIG. 9; in the case where the memory cells of the memory cell array 110 are programmed to have the anti-parallel state, the number of fail bits according to a value of the reference resistance Rref may have the tendency corresponding to the graph G2 of FIG. 9. The test device may obtain (or draw) the graph G3 based on the graphs G1 and G2 of FIG. 9 and may determine an improved (e.g. optimal) reference resistance value corresponding to the smallest number of fail bits and an improved (e.g. optimal) read voltage value corresponding thereto.

Figure 13:
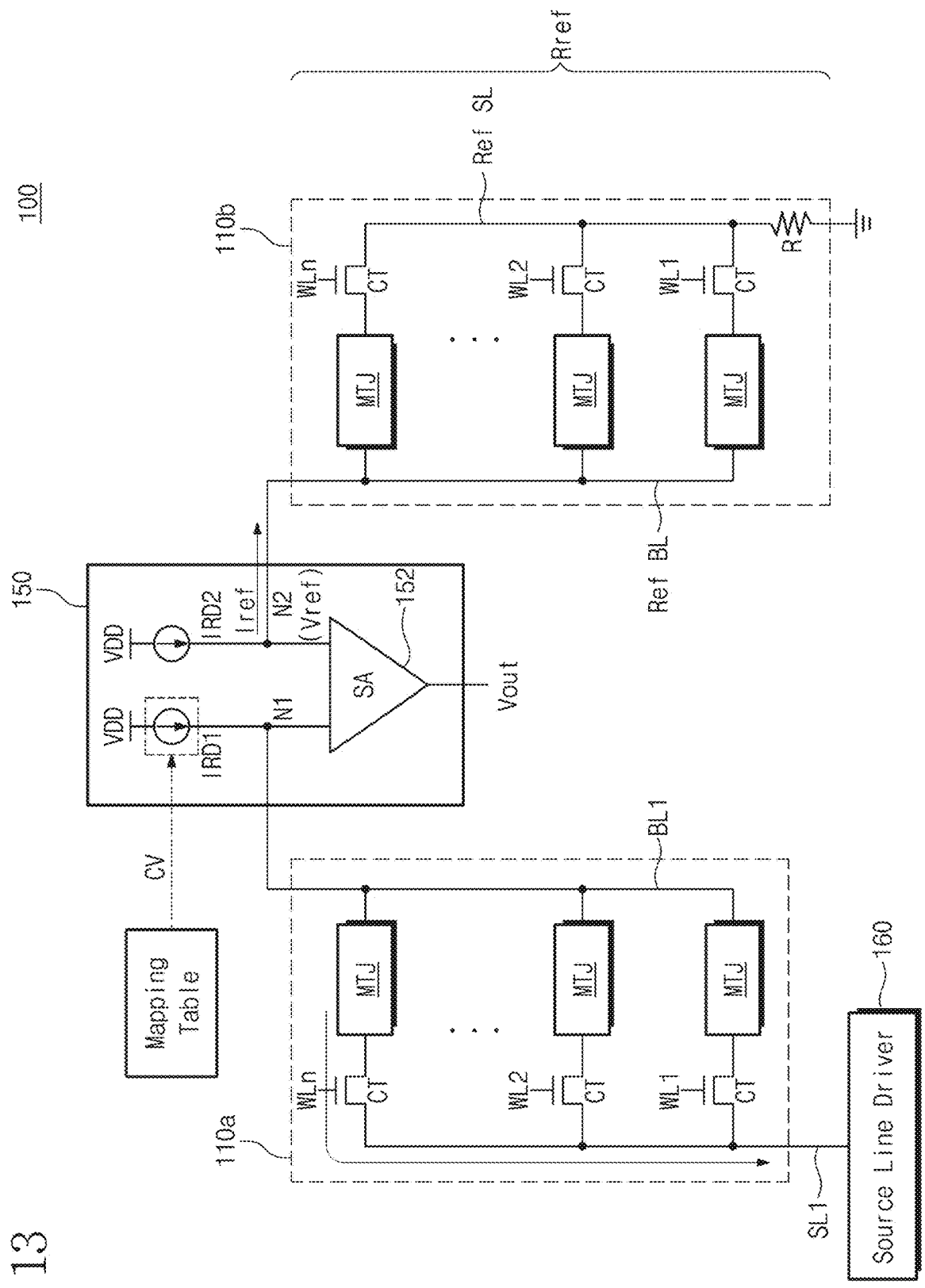
FIG. 13 conceptually illustrates how a memory device is tested, according to some example embodiments of inventive concepts.

FIG. 13 conceptually illustrates how a memory device is tested, according to some example embodiments of inventive concepts. In detail, example embodiments of FIG. 13 may be associated with determining an improved (e.g. optimal) reference resistance value, which is performed in the process of testing a memory device. Example embodiments, for example illustrated in FIG. 13 are mostly similar to example embodiments illustrated in FIG. 12.

A memory cell array may include a first region 110a and a second region 110b. The memory cell array may include a plurality of memory cells each including an MTJ element and a cell transistor.

The first region 110a may be a region in which data are stored and may include memory cells connected with or to a plurality of bit lines and a plurality of source lines. However, for brevity of drawing, the memory cells of the first region 110a is illustrated as being connected with or to the first bit line BL1 and the first source line SL1.

The second region 110b may include components (and/or elements) necessary to or used to generate the reference voltage Vref that is used to read data stored in a memory cell of the first region 110a. For example, the second region 110b may include a plurality of memory cells connected with or to the reference bit line Ref BL and a reference source line Ref SL, and a resistor "R".

In some example embodiments, the memory cells of the first region 110a and the memory cells of the second region 110b may be substantially identical. The reference bit line Ref BL may be substantially identical in structure to the first bit line BL1, and the reference source line Ref SL may be substantially identical in structure to the first source line SL1. That is, the first region 110a and the second region 110b may be provided by the same fabricating process. However, depending on some example embodiments, the resistor "R" may be provided or may not be provided.

The sensing circuit 150 may be configured to read data stored in a memory cell connected with the or to first bit line BL1. For example, the sensing circuit 150 may include current sources generating the first read current IRD1 and the second read current IRD2, and the sense amplifier 152. The sensing circuit 150 may determine a voltage drop in the selected memory cell of the first bit line BL1 by using the first read current IRD1.

Alternatively or additionally, the sensing circuit 150 may determine a voltage drop in a memory cell connected with or to the reference bit line Ref BL by using the second read current IRD2. For example, the second read current IRD2 may be input to a memory cell, which is selected as the cell transistor CT is turned on, through the reference bit line Ref BL. Accordingly, a voltage drop in the second region 110b may be regarded as a voltage drop by the reference resistance Rref.

According to some example embodiments, there may be no need to perform a fail bit counting operation in the first region 110a every reference resistance while the reference resistor Rref is replaced as described with reference to some example embodiments of FIG. 12. Instead, fail bits in the first region 110a may be counted while a resistance value of the variable resistor Rref is changed by appropriately controlling the on/off of the cell transistors CT of the second region 110b.

Alternatively or additionally, even though only one reference bit line Ref BL is illustrated in FIG. 13 as connected with or to the second node N2, more reference bit lines may be connected with or to the second node N2. For example, a reference bit line that is connected with memory cells having the same structure as the second region 110b illustrated in FIG. 13 may be further connected with or to the second node N2.

In some example embodiments above described with reference to FIGS. 12 and 13, an improved (e.g. optimal) reference resistance value may be used to determine an improved (e.g. optimal) read current value. The reference resistance value and the read current value thus determined may be stored in a specific region (e.g., an anti-fuse array) of the memory device 100.

Figure 14:
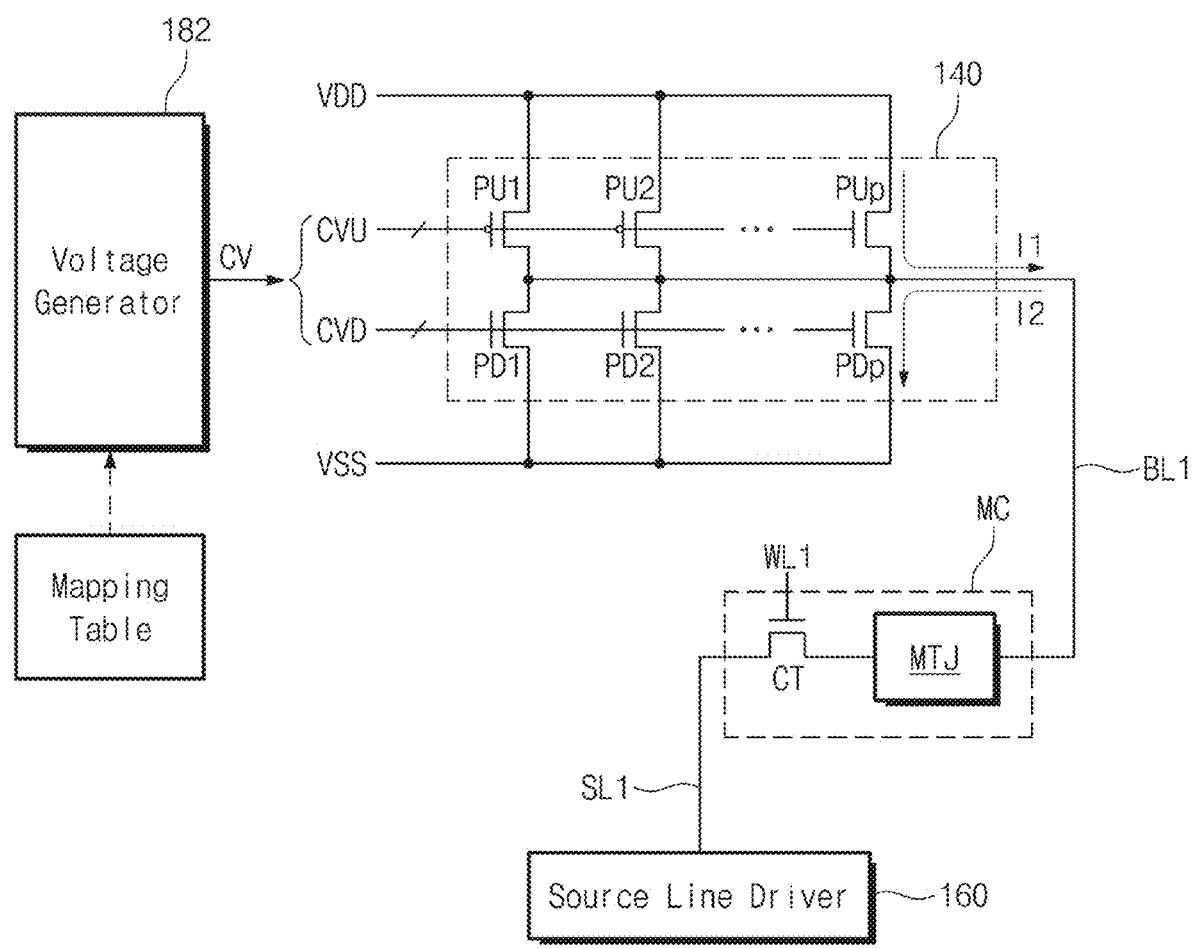
FIG. 14 illustrates a configuration of a driver of FIG. 11.

FIG. 14 illustrates a configuration of a driver of FIG. 11. In detail, example embodiments of FIG. 14 may be associated with performing a program operation depending on an improved (e.g. optimal) read current value determined in the process of testing a memory device.

The write driver 140 may include transistors PU1 to PUp and PD1 to PDp. The transistors PU1 to PUp may be connected between the first bit line BL1 and a first power supply voltage VDD. The transistors PD1 to PDp may be connected between the first bit line BL1 and a second power supply voltage VSS. For example, a level of the first power supply voltage VDD may be higher than a level of the second power supply voltage VSS, and a level of a voltage of the source line SL1 may be between the level of the first power supply voltage VDD and the level of the second power supply voltage VSS. For example, the power supply voltages VDD and VSS may be provided from the voltage generator 182 or may be provided from a separate voltage generator.

The write driver 140 may be connected with or to the memory cell MC through the first bit line BL1 selected by the column decoder 130 (refer to FIG. 2). In some example embodiments, additional drivers that are implemented the same as the write driver 140 may be respectively provided for respective bit lines different from the first bit line BL1. However, for brevity of drawing, descriptions associated with the additional drivers will be omitted.

The voltage generator 182 may generate the code value CV for controlling the write driver 140. The code value CV may be based on a mapping table associated with a value of a program voltage determined in advance. The code value CV may include a first code value CVU and a second code value CVD. The first code value CVU and the second code value CVD may be implemented with a single code value CV or may be provided independently of each other. Some example embodiments is illustrated in FIG. 14 as the first code value CVU and the second code value CVD are provided as separate code values.

Each of the transistors PU1 to PUp may be turned on or turned off based on the first code value CVU. For example, in the case where each of the transistors PU1 to PUp is a p-channel metal oxide semiconductor field effect transistor (MOSFET), each of the transistors PU1 to PUp may be turned on in response to a bit of logic "0" and may be turned off in response to a bit of logic "1".

Each of the transistors PD1 to PDp may be turned on or turned off based on the second code value CVD. For example, in the case where each of the transistors PD1 to PDp is an n-channel metal oxide semiconductor field effect transistor (MOSFET), each of the transistors PD1 to PDp may be turned on in response to a bit of logic "1" and may be turned off in response to a bit of logic "0". However, the configuration of the write driver 140 of FIG. 14 may be only an example, and it may be understood that the configuration of the write driver 140 may be variously modified or changed to be different from the configuration of FIG. 14.

Turned-on transistors may provide a current path for a write current I1/I2. Accordingly, the transistors PU1 to PUp and the transistors PD1 to PDp may drive the write current I1/I2 based on the first code value CVU and the second code value CVD.

For example, in the case where one or more of the transistors PU1 to PUp are turned on and the transistors PD1 to PDp are turned off, a voltage of the first bit line BL1 may be pulled up to the first power supply voltage VDD. In this case, the write current I1 may be provided from the first bit line BL1 to the first source line SL1.

In contrast, in the case where the transistors PU1 to PUp are turned off and one or more of the transistors PD1 to PDp are turned on, a voltage of the first bit line BL1 may be pulled down to the second power supply voltage VSS. In this case, the write current I2 may be provided from the first source line SL1 to the first bit line BL1. A data state of the memory cell MC may depend on the write current I1/I2.

The number of transistors to be turned on from among the transistors PU1 to and PUp may vary depending on bits of the first code value CVU. The number of transistors to be turned on from among the transistors PD1 to and PDp may vary depending on bits of the second code value CVD. The intensity of the write current I1/I2 may vary depending on the number of turned-on transistors.

As the number of turned-on transistors increases, the intensity of the write current I1/I2 may increase. The intensity of the write current I1/I2 may correspond to a sum of intensities of currents driven by turned-on transistors. Accordingly, the intensity of the write current I1/I2 may be adjusted based on the first code value CVU and the second code value CVD.

According to the above description, the write driver 140 may be configured to drive write currents with different intensities. A value of the write current I1/I2 flowing through the memory cell MC may be adjusted to have one of the different intensities provided by the write driver 140.

Figure 15:
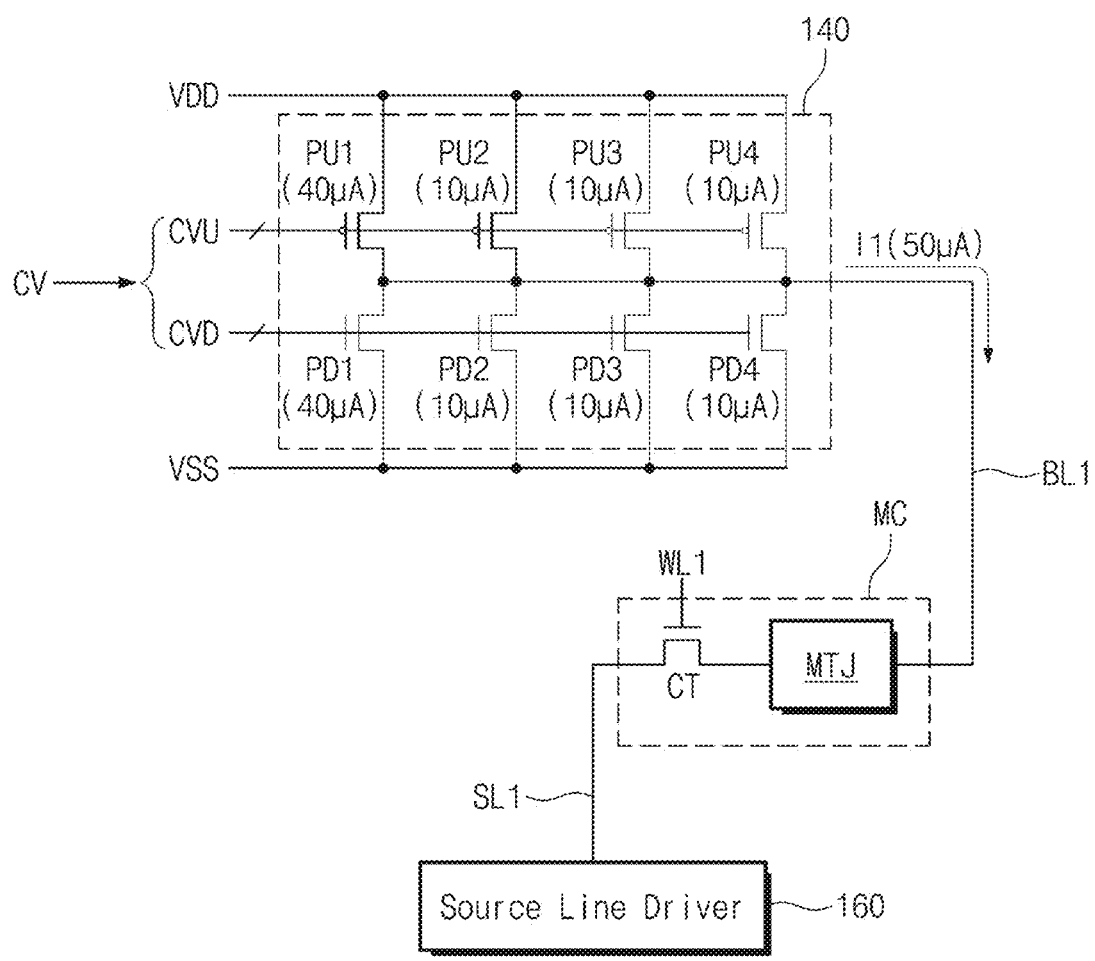
FIGS. 15 and 16 illustrate operations of a driver operating based on a code value output from a voltage generator of FIG. 14.
Figure 16:
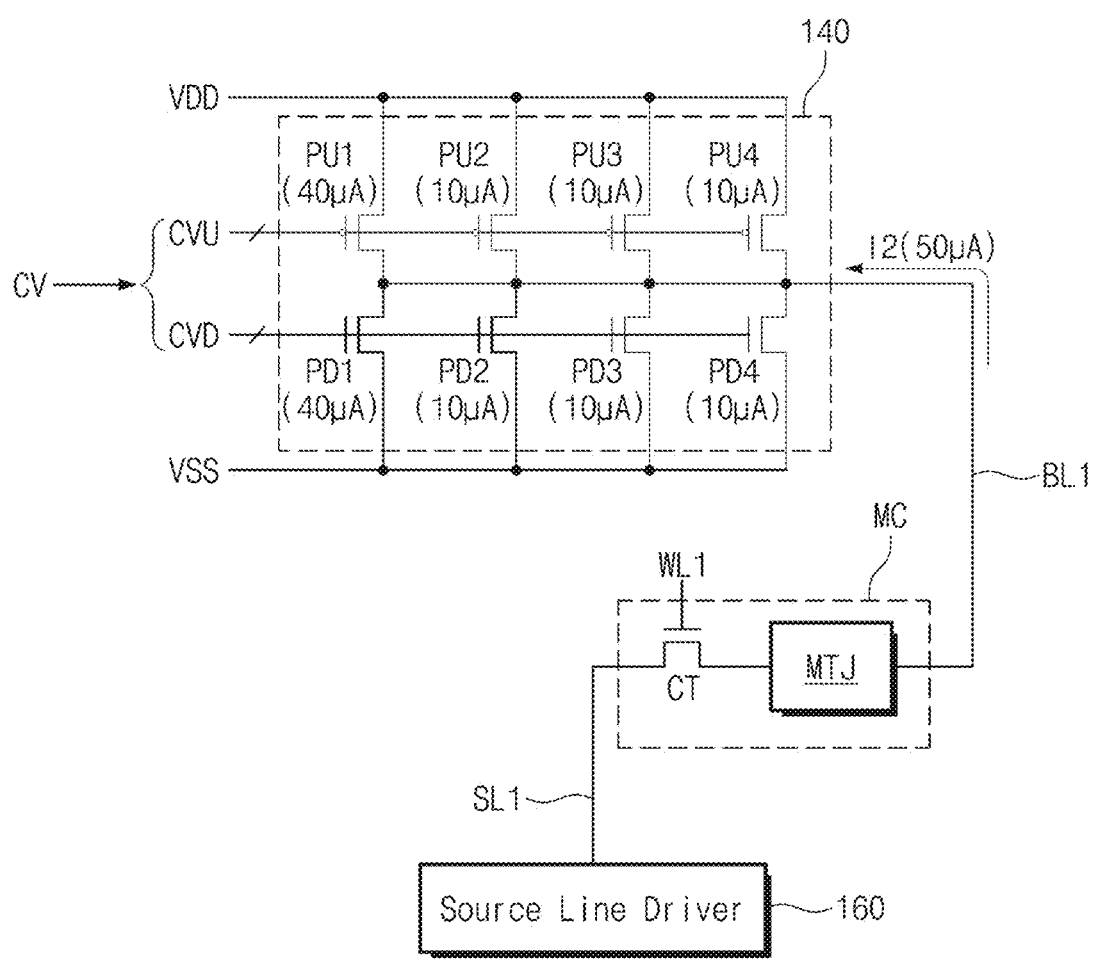

FIGS. 15 and 16 illustrate operations of the write driver 140 operating based on the code value CV output from the voltage generator 182 of FIG. 14.

Referring to FIGS. 15 and 16, the write driver 140 may include transistors PU1 to PU4 and transistors PD1 to PD4. For example, each of the transistors PU1 and PD1 may have a channel width for driving a current of 40 µA, and each of the transistors PU2 to PU4 and PD2 to PD4 may have a channel width for driving a current of 10 µA.

In some example embodiments, FIG. 15 may be associated with the case where the write driver 140 pulls up a voltage of the first bit line BL1 to the first power supply voltage VDD. In example embodiments of FIG. 15, the write driver 140 may be provided with voltages corresponding to the first code value CVU of "0011" and voltages corresponding to the second code value CVD of "0000" from the voltage generator 182 (refer to FIG. 14).

Referring to FIG. 15, the transistors PD1 to PD4 may be turned off in response to the second code value CVD. The transistors PU1 and PU2 may be turned on in response to bits having logic "0" from among bits of the first code value CVU, and the transistors PU3 and PU4 may be turned off in response to bits having logic "1" from among the bits of the first code value CVU. Accordingly, the write current I1 of 50 µA may be driven through the turned-on transistors PU1 and PU2.

In some example embodiments, FIG. 16 may be associated with the case where the write driver 140 pulls down a voltage of the first bit line BL1 to the second power supply voltage VSS. In example embodiments of FIG. 16, the write driver 140 may be provided with the first code value CVU of "1111" and the second code value CVD of "1100" from the voltage generator 182.

Referring to FIG. 16, the transistors PU1 to PU4 may be turned off in response to the first code value CVU. The transistors PD1 and PD2 may be turned on in response to bits having logic "1" from among bits of the second code value CVD, and the transistors PD3 and PD4 may be turned off in response to bits having logic "0" from among the bits of the second code value CVD. Accordingly, the write current I2 of 50 µA may be driven through the turned-on transistors PD1 and PD2.

In some example embodiments, example embodiments of FIG. 15 may be associated with the case of storing data of logic "0" in the memory cell MC, and example embodiments of FIG. 16 may be associated with the case of storing data of logic "1" in the memory cell MC. For example, to provide a code value of the mapping table illustrated in FIG. 10 to the transistors PU1 to PU4 and PD1 to PD4 constituting the driver 140, the voltage generator 182 may include components such as a switch and a multiplexer.

As described with reference to FIGS. 14 to 16, the occurrence of fail bits may decrease by performing a read operation by using an improved (e.g. optimal) read current (or voltage) determined in the process of testing the memory device. As a result, the reliability of a memory device may be improved. In addition, the read disturbance may be prevented or reduced by preventing or reducing the read operation from being performed by using an excessive read current (and/or voltage).

Figure 17:
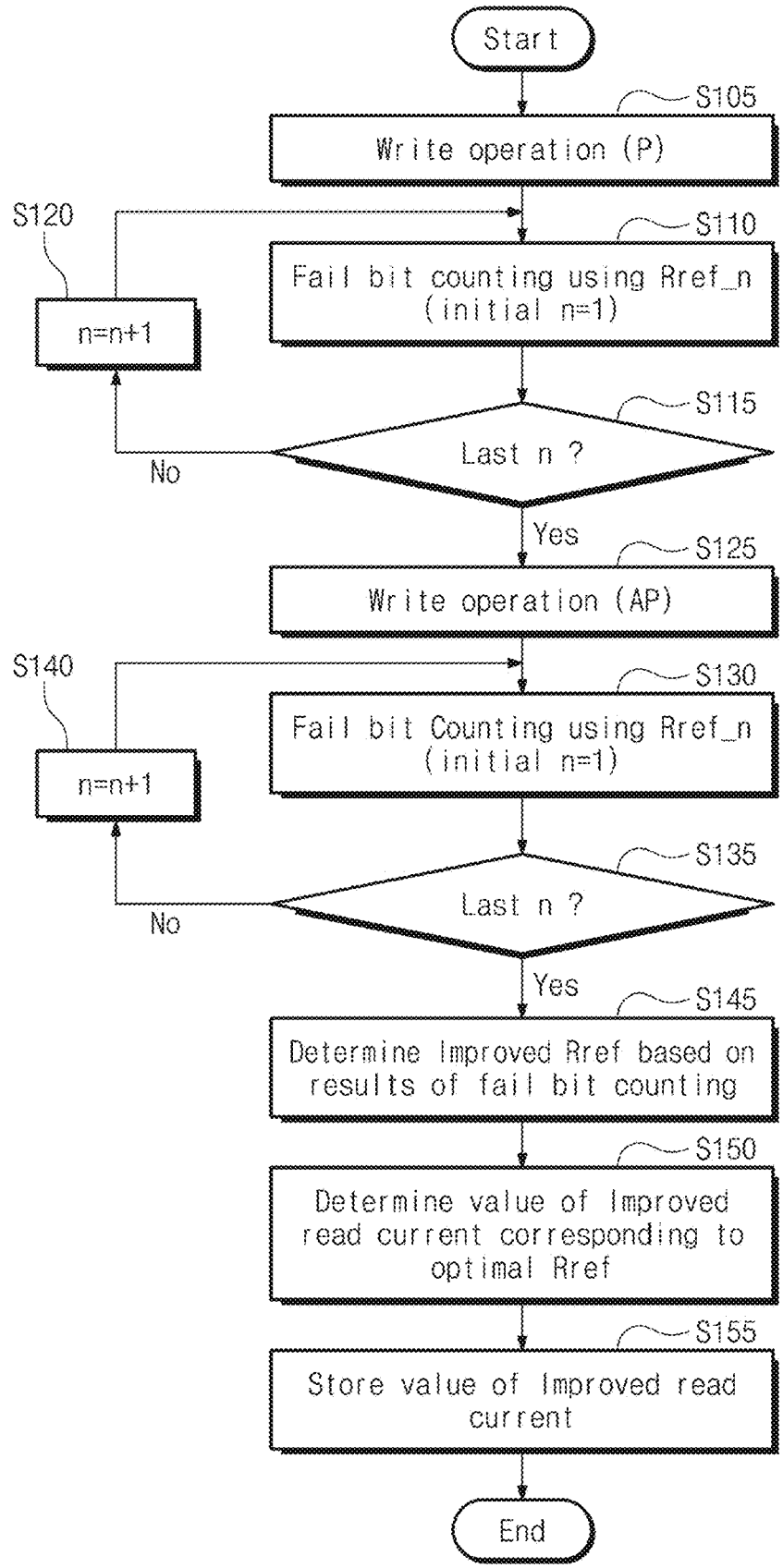
FIG. 17 is a flowchart illustrating a test method of a memory device according to some example embodiments of inventive concepts.

FIG. 17 is a flowchart illustrating a test method of a memory device according to some example embodiments of inventive concepts.

In operation S105, a program operation (and/or a write operation) may be performed on a memory device. For example, the test device may program memory cells constituting the memory device to have the resistance distribution Rp of the parallel state of FIG. 9.

In operation S110, fail bit counting may be performed on the memory device. In some example embodiments, the test device may count the number of fail bits of memory cells while varying a value of the reference resistance Rref. For example, the expression that an initial value of the reference resistance Rref is "1" may only mean an order of a reference resistance to be used in the test operation and may not be associated with a detailed reference resistance value. That is, a value of the reference resistance Rref that is first selected may not indicate the smallest value of reference resistance values to be used to perform the test operation and may be any value selected by a memory vendor.

Afterwards, the test device may count the number of fail bits of memory cells while varying a value of the reference resistance Rref (i.e., may repeatedly perform operation S110, operation S115, and operation S120). As the fail bit counting operations using all reference resistances provided for the test operation are completed, the fail bit counting operation associated with the parallel state may end.

In operation S125, a program operation (or a write operation) may be performed on the memory device. For example, the test device may program the memory cells constituting the memory device to have the resistance distribution Rap of the anti-parallel state of FIG. 9.

In operation S130, fail bit counting may be performed on the memory device. In some example embodiments, the test device may count the number of fail bits of memory cells while varying a value of the reference resistance Rref. As in the fail bit counting associated with the parallel state, a value of the reference resistance Rref selected in the fail bit counting may be randomly selected from provided reference resistance values regardless of an order of the reference resistance values.

The test device may count the number of fail bits of the memory cells while changing a value of the reference resistance Rref (i.e., may repeatedly perform operation S130, operation S135, and operation S140); when the fail bit counting operations using all reference resistance values provided for the test operation are completed, the fail bit counting operation associated with the anti-parallel state may end.

In operation S145, an improved (e.g. optimal) reference resistance value may be determined based on fail bit counting results. For example, the test device may add the number of fail bits counted in the parallel state and the number of fail bits counted in the anti-parallel state, for each of reference resistance values, and may select a reference resistance value corresponding to the smallest addition result as an improved (e.g. optimal) reference resistance value.

In operation S150, an improved (e.g. optimal) read current (or voltage) value corresponding to the improved (e.g. optimal) reference resistance value may be determined. In some example embodiments, a reference resistance value and a read current value may have the tendency (e.g., an inversely proportional relationship or a reciprocal relationship) like the graph illustrated in FIG. 10. Accordingly, a relatively small value of read current (or voltage) may be required to perform a read operation on a memory device (e.g., C1 of FIG. 1) provided relatively close to the periphery of the substrate 1 (refer to FIG. 1). In contrast, a relatively large value of read current (or voltage) may be required to perform a read operation on a memory device (e.g., C2 of FIG. 1) provided relatively close to the center of the substrate 1 (refer to FIG. 1).

In operation S155, the improved (e.g. optimal) read current (or voltage) value may be stored in the memory device. In some example embodiments, an improved (e.g. optimal) reference resistance value and an improved (e.g. optimal) read current (or voltage) corresponding thereto may be stored in the memory device. Alternatively, as illustrated in FIG. 10, a mapping table in which a read current value corresponding to each reference resistance value is defined may be stored in the memory device. In this case, a reference resistance value and a read current value associated with the corresponding memory device may be directed in a read operation that is performed by the end user. In some example embodiments, an improved (e.g. optimal) reference resistance value, a read current value corresponding thereto, and/or the table may be stored in the anti-fuse array or the like of the memory device, but inventive concepts are not limited thereto.

Figure 18:
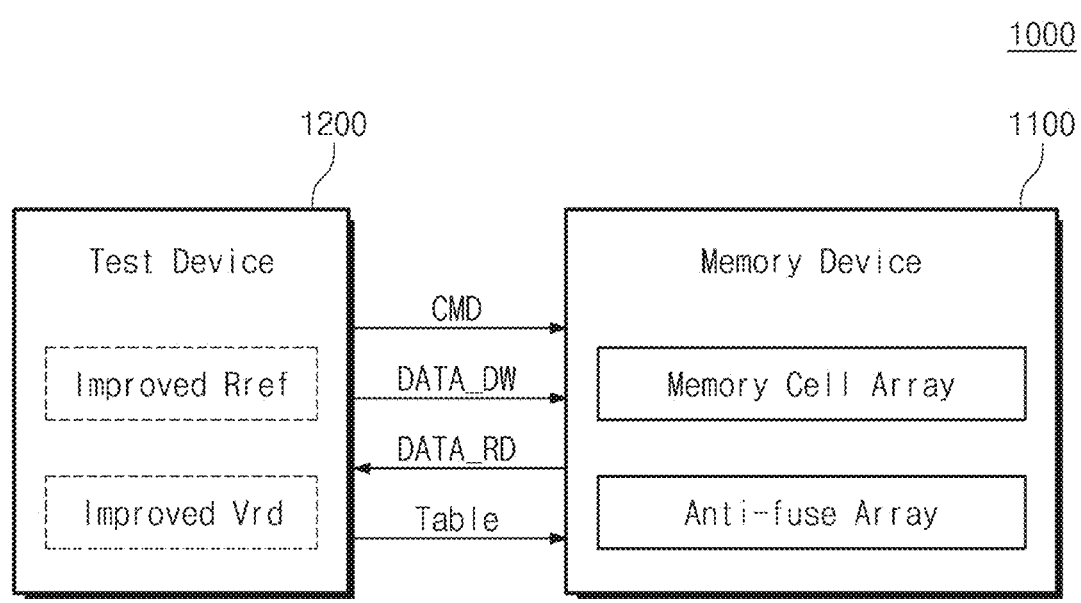
FIG. 18 illustrates a test system according to some example embodiments of inventive concepts.

FIG. 18 illustrates a test system according to some example embodiments of inventive concepts. A test system 1000 may include a memory device 1100 and a test device 1200.

The memory device 1100 includes a memory cell array. In some example embodiments, the memory device 1100 may be an implementation example of the memory device 100 described with reference to FIGS. 1 to 17. The memory cell array 1110 may include a first region and a second region (not shown). For example, the first region 1112 that is a user region may be a region in which data intended by the user are stored. The second region 1114 that is a vendor region may be a region in which data intended by a memory vendor are stored. For example, an improved (e.g. optimal) reference resistance value and an improved (e.g. optimal) read current value corresponding thereto, which are described with reference to FIGS. 1 to 17, may be stored in the second region 1114.

The test device 1200 may perform various test operations on the memory device 1100. To this end, the test device 1200 may send a command CMD to the memory device 1100.

In some example embodiments, the command CMD may include a command for programming the first region 1112 of the memory cell array 1100 to a specific program state (e.g., the parallel state or the anti-parallel state). The test device 1200 may send dummy write data DATA_DW for programming the first region 1112 to the parallel state or the anti-parallel state, together with sending the command CMD.

In some example embodiments, the command CMD may direct a read operation for counting the number of fail bits every reference resistance with regard to the specific program state (i.e., the parallel state or the anti-parallel state). Read data DATA_RD may be received from the memory device 1100 as a read result.

In some example embodiments, the test device 1200 may count the number of fail bits every reference resistance based on the read data DATA_RD received from the memory device 1100, may determine an value of the improved (e.g. optimal) reference resistance Rref based on counting results, and may determine a value of an improved (e.g. optimal) read current (or voltage) based on the value of the improved (e.g. optimal) reference resistance Rref.

In some example embodiments, the test device 1200 may store the value of the improved (e.g. optimal) reference resistance Rref and the value of the improved (e.g. optimal) read current (or voltage) in the memory device 1100 in the form of a table. For example, the table may be stored in the second region 1114 of the memory cell array 110. For example, the second region 1114 may include an anti-fuse cell array.

Meanwhile, the above embodiments are described as the pre-program operation, a fail bit counting operation, an operation of determining a value of an improved (e.g. optimal) reference resistance, and an operation of determining a value of an improved (e.g. optimal) read current are performed in units of a memory device (i.e., a semiconductor chip). However, in another embodiment, an improved (e.g. optimal) read current value may be determined depending on a different criterion, not a memory device (i.e., semiconductor chip) unit. For example, in one memory device, because distances of memory cells from the center of a substrate are different, the memory cells may be classified into a plurality of regions, and an improved (e.g. optimal) read current value may be determined for each region.

According to some example embodiments disclosed above, an improved (e.g. optimal) reference resistance value and an improved (e.g. optimal) read current (or voltage) value of a memory device may be determined by performing only two pre-program operations (i.e., respectively associated with the parallel state and the anti-parallel state) on the memory device. Accordingly, a time and costs necessary to determine an improved (e.g. optimal) read current value may decrease. In addition, because a read operation is performed by using a read current (or voltage), the value of which is optimized according to a characteristic (i.e., a size of an MRAM cell) of the memory device, the reliability and endurance of the memory device may be improved.

According to some example embodiments of inventive concepts, it may be possible to determine a value of an improved (e.g. optimal) reference resistance through the minimum or reduced number of times of a program operation. A value of an improved (e.g. optimal) read current based on the value of the reference resistance may thus may be determined.

In this case, a read operation may be prevented or reducing the likelihood of and/or impact from being performed by using an excessive read current, and thus, the read disturbance may be prevented or reducing the likelihood of and/or impact from occurring.

Alternatively or additionally, a read operation may be prevented or reduced from being performed by using an insufficient read current, and thus, the read fail may be prevented or reduced from occurring.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Example embodiments are not limited to those disclosed above. Furthermore none of the example embodiments are intended to be or are necessarily mutually exclusive with one another. For example, some example embodiments may include features described with reference to one or more figures, and may also include features described with reference to one or more other figures.

While inventive concepts have been described with reference to some example embodiments thereof, it will be apparent to those of ordinary skill in the art that various changes and modifications may be made thereto without departing from the spirit and scope of inventive concepts as set forth in the following claims.

What is claimed is:

1. A memory device comprising:
a memory cell array including a first region and a second region, the memory cell array configured to store a value of a first read current determined based on a value of a reference resistance to distinguish a parallel state and an anti-parallel state of a programmed memory cell;
a sensing circuit configured to generate the first read current based on the value of the first read current and to perform a read operation on the first region based on the first read current;
a write driver configured to perform a program operation on the first region based on a write code value,
wherein the write driver includes,
first-type transistors each including a first end connected to a first power supply voltage and a second end connected to an output node; and
second-type transistors each including a first end connected to a second power supply voltage and a second end connected to the output node.

2. The memory device of claim 1, wherein the memory cell array includes a plurality of memory cells, and
each of the plurality of memory cells includes:
a cell transistor including a first end and a gate electrode, the first end of the cell transistor connected to a source line and the gate electrode of the cell transistor connected to a word line; and
a magnetic tunneling junction element including a first end and a second end, the first end of the magnetic tunneling junction element connected to a second end of the cell transistor and the second end of the magnetic tunneling junction element connected to a bit line.

3. The memory device of claim 2, wherein each of the plurality of memory cells includes,
a second cell transistor including a first end and a gate electrode, the first end of the second cell transistor connected to the source line and the gate electrode of the second cell transistor is connected to a sub-word line.

4. The memory device of claim 3, wherein
the first end of the magnetic tunneling junction element is connected to a secnd end of the second cell transistor.

5. The memory device of claim 1, wherein the sensing circuit includes
a first current source configured to generate the first read current;
a second current source configured to generate a second read current; and
a sense amplifier configured to amplify a difference between a first voltage drop and a second voltage drop, the first voltage drop at a first node according to an application of the first read current to a bit line connected to a selected memory cell, the second voltage drop at a second node according to an application of the second read current to a reference bit line.

6. The memory device of claim 5, wherein a resistor having the value of the reference resistance is connected to the reference bit line.

7. The memory device of claim 6, wherein the resistor having the value of the reference resistance is a gate polysilicon corresponding to gate electrode of a transistor included in the memory cell array.

8. The memory device of claim 5, wherein at least one memory cell having an identical geometric structure as the selected memory cell is connected to the reference bit line.

9. The memory device of claim 1, wherein the write code value includes a first code value and a second code value,
the first-type transistors receive corresponding bits of the first code value from a voltage generator, respectively, and
the second-type transistors receive corresponding bits of the second code value from the voltage generator, respectively.

10. The memory device of claim 1, wherein the second region corresponds to an anti-fuse cell array.

11. The memory device of claim 1, wherein the second region corresponds to a fuse cell array.

12. The memory device of claim 1, further comprising:
a source line driver configured to drive a source line with a voltage.

13. The memory device of claim 12, wherein a voltage generator is configured to control the source line driver and set the value of the voltage of the source line driver that is applied to the source line.

14. The memory device of claim 1, further comprising:
a column decoder configured to select a bit line connected to a memory cell selected form memory cells of the first region; and
a row decoder configured to drive the bit line connected to the selected memory cell.

15. A memory device comprising:
a memory cell array including a first region, and a second region, the memory cell array configured to store a reference resistance value and a value of a read current determined based on the reference resistance value, wherein
the reference resistance value is determined based on a first result of counting a number of fail bits of the first region programmed to a first state for each resistance value and a second result of counting a number of fail bits of the first region programmed to a second state for each resistance value;
a column decoder configured to select a bit line connected to a memory cell selected from memory cells of the first region;
a row decoder configured to drive the bit line connected to the selected memory cell; and
a sensing circuit configured to generate a first read current based on the value of the read current and to read data stored in the selected memory cell based on the first read current.

16. The memory device of claim 15, wherein each of the memory cells of the first region includes:
a cell transistor including a first end and a gate electrode, the first end of the cell transistor connected to a source line and the gate electrode of the cell transistor connected to a word line; and
a magnetic tunneling junction element including a first end and a second end, the first end of the magnetic tunneling junction element connected to a second end of the cell transistor and the second end of the magnetic tunneling junction element connected to a bit line.

17. The memory device of claim 15, wherein the sensing circuit includes
a first current source configured to generate the first read current;
a second current source configured to generate a second read current; and a sense amplifier configured to amplify a difference between a first voltage drop and a second voltage drop, the first voltage drop at a first node according to an application of the first read current to a bit line connected to the selected memory cell and the second voltage drop at a second node according to an application of the second read current to a reference bit line.

18. The memory device of claim 15, further comprising:
a voltage generator configured to generate a code value; and
a write driver configured to perform a program operation on the first region based on the code value,
wherein the write driver includes,
first-type transistors each including a first end connected to a first power supply voltage and a second end connected to an output node, and
second-type transistors each including a first end connected to a second power supply voltage and a second end connected to the output node.

19. The memory device of claim 18, wherein the code value includes a first code value and a second code value,
the first-type transistors receive corresponding bits of the first code value from the voltage generator, respectively, and
the second-type transistors receive corresponding bits of the second code value from the voltage generator, respectively.

* * * * *